(12) United States Patent
Matsuoka

(10) Patent No.: US 9,755,588 B2
(45) Date of Patent: Sep. 5, 2017

(54) SIGNAL OUTPUT CIRCUIT

(71) Applicant: Asahi Kasei Microdevices Corporation, Tokyo (JP)

(72) Inventor: Daisuke Matsuoka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/779,642

(22) PCT Filed: Mar. 27, 2014

(86) PCT No.: PCT/JP2014/001809
§ 371 (c)(1),
(2) Date: Sep. 24, 2015

(87) PCT Pub. No.: WO2014/156180
PCT Pub. Date: Oct. 2, 2014

(65) Prior Publication Data
US 2016/0056775 A1    Feb. 25, 2016

(30) Foreign Application Priority Data

Mar. 28, 2013 (JP) ................. 2013-069183
Mar. 28, 2013 (JP) ................. 2013-069192

(51) Int. Cl.
*H03F 1/02* (2006.01)
*H03F 3/45* (2006.01)
(Continued)

(52) U.S. Cl.
CPC ............. *H03F 3/005* (2013.01); *H02M 3/07* (2013.01); *H03F 1/0205* (2013.01);
(Continued)

(58) Field of Classification Search
CPC .... H03F 1/0205; H03F 3/005; H03F 3/45076; H03F 3/45183; H03F 2200/297;
(Continued)

(56) References Cited

U.S. PATENT DOCUMENTS 5,289,137 A    2/1994 Nodar et al.
6,128,039 A *  10/2000 Chen ................. G11C 19/285
                                                    250/208.1
(Continued)

FOREIGN PATENT DOCUMENTS

JP    H05-347519 A    12/1993
JP    2009-055592 A    3/2009
(Continued)

OTHER PUBLICATIONS

Gregoire, "An Over-60 dB True Rail-to-Rail Performance Using Correlated Level Shifting and an Opamp With Only 30 dB Loop Gain", IEEE Journal of Solid-State Circuits, vol. 43, No. 12, Dec. 2008, pp. 2620-2630.*

(Continued)

*Primary Examiner* — Steven J Mottola
*Assistant Examiner* — Hafizur Rahman
(74) *Attorney, Agent, or Firm* — Morgan, Lewis & Bockius LLP

(57) ABSTRACT

An object is to output output signal amplitude exceeding power supply voltage or output signal amplitude falling below ground voltage without requiring a charge pump circuit or the like to generate positive or negative power supply voltage for an operational amplifier. The present invention provides a signal output circuit comprising an operational amplifier including: an amplification stage configured to amplify differential input voltage; and an output stage configured to amplify an input signal amplified by the amplification stage and output the input signal as an output (Continued)

signal, wherein the output stage is a switched capacitor circuit which includes switches and a capacitor configured to sample differential voltage between input voltage outputted from the amplification stage and voltage other than the input voltage and which transfers the differential voltage sampled by the capacitor by switching of the switches based on the input voltage.

26 Claims, 20 Drawing Sheets

(51) Int. Cl.
*H03F 3/00* (2006.01)
*H02M 3/07* (2006.01)

(52) U.S. Cl.
CPC ..... *H03F 3/45076* (2013.01); *H03F 3/45183* (2013.01); *H03F 2200/297* (2013.01); *H03F 2200/513* (2013.01); *H03F 2203/45012* (2013.01); *H03F 2203/45674* (2013.01)

(58) Field of Classification Search
CPC ..... H03F 2200/513; H03F 2203/45012; H03F 2203/45674; H02M 3/07
USPC ......... 330/9, 69, 252; 327/94, 95, 536, 552, 327/558; 341/120, 122, 143, 150, 155, 341/162, 172
See application file for complete search history.

(56) References Cited

U.S. PATENT DOCUMENTS

| | | |
|---|---|---|
| 7,844,233 B2 | 11/2010 | Vaisanen |
| 2011/0084746 A1* | 4/2011 | Llewellyn ............ H03K 17/164 327/170 |
| 2013/0207717 A1* | 8/2013 | Matsuoka ................. G05F 1/10 327/536 |
| 2015/0255173 A1* | 9/2015 | Tokunaga ............... H03F 3/005 341/172 |

FOREIGN PATENT DOCUMENTS

| | | |
|---|---|---|
| JP | 2011-205540 A | 10/2011 |
| JP | 2012-044347 A | 3/2012 |
| JP | 2012-085133 A | 4/2012 |
| WO | 2014/083736 A1 | 6/2014 |

OTHER PUBLICATIONS

MT-088 Tutorial, "Analog Switches and Multiplexers Basics", Copyright 2009, Analog Devices, Inc, pp. 1-23.*
Gregoire et al., "An Over-60dB True Rail-to-Rail Performance Using Correlated Level Shifting and an Opamp with 30dB Loop Gain," Solid-State Circuits Conference, ISSCC 2008, Digest of Technical Papers, IEEE International, 540, 541, 634 (2008).
International Preliminary Report on Patentability and Written Opinion issued in corresponding International Patent Application No. PCT/JP2014/001809 dated Sep. 29, 2015.
International Search Report issued in corresponding International Patent Application No. PCT/JP2014/001809 dated Jul. 1, 2014.

\* cited by examiner

| | SAMPLING PERIOD | TRANSFER PERIOD | SAMPLING PERIOD | TRANSFER PERIOD |
|---|---|---|---|---|
| (a) STATE OF SWITCHED CAPACITOR OUTPUT STAGE | | | | |
| (b) STATE OF SW1 | ON | OFF | ON | OFF |
| (c) STATE OF SW2 | OFF | ON | OFF | ON |
| (d) STATE OF SW3 | ON | OFF | ON | OFF |
| (e) STATE OF SW4 | OFF | ON | OFF | ON |

SIGNAL OUTPUT CIRCUIT

TECHNICAL FIELD

The present invention relates to a signal output circuit, or more specifically relates to a signal output circuit, an operational amplifier, and a charge pump circuit which are capable of outputting output signal amplitude exceeding power supply voltage for the operational amplifier, and output signal amplitude falling below ground voltage.

BACKGROUND ART

In recent years, there has been developed a signal output circuit which includes an operational amplifier capable of outputting output signal amplitude exceeding power supply voltage connected to the operational amplifier and output signal amplitude falling below ground voltage.

FIG. 1 is a block diagram illustrating a signal output circuit 100 which is an example of a conventional signal output circuit configured to output a signal exceeding power supply voltage. The signal output circuit 100 illustrated in FIG. 1 includes an operational amplifier 110 and a charge pump 120 configured to generate positive power supply for the operational amplifier 110 (see Patent Document 1 for example).

The signal output circuit 100 illustrated in FIG. 1 includes the charge pump 120 as a circuit generating a positive power supply voltage separate from the operational amplifier 110. The charge pump 120 uses power supply (121) voltage which are input voltage and ground (122) voltage to output positive voltage higher than output signal amplitude outputted by the operational amplifier 110, and outputs the positive voltage to the operational amplifier 110. The operational amplifier 110 outputs output signal amplitude exceeding the power supply voltage for the operational amplifier 110 by using the positive voltage outputted by the charge pump 120 as the positive power supply voltage for the operational amplifier 110.

FIG. 2 is a block diagram illustrating a signal output circuit 200 which is an example of a conventional signal output circuit configured to output a signal falling below the ground. The signal output circuit 200 described in FIG. 2 includes an operational amplifier 210 and a charge pump 220 configured to generate negative power supply for the operational amplifier 210.

The signal output circuit 200 illustrated in FIG. 2 includes the charge pump 220 as a circuit generating a negative power supply voltage separate from the operational amplifier 210. The charge pump 220 uses power supply (221) which are input voltage voltage and ground (222) voltage, which are input voltage, to output negative voltage lower than output signal amplitude outputted by the operational amplifier 210, and outputs the negative voltage to the operational amplifier 210. The operational amplifier 210 outputs output signal amplitude falling below the ground voltage by using the negative voltage outputted by the charge pump 220 as the negative power supply voltage for the operational amplifier 210.

As described above, the signal output circuit 100 can output the output signal amplitude exceeding the power supply voltage for the operational amplifier, and the signal output circuit 200 can output the output signal amplitude falling below the ground voltage.

In the conventional technique, the charge pump generates the positive power supply or negative power supply for use in the operational amplifier, which outputs the output signal amplitude exceeding the power supply voltage or the output signal amplitude falling below the ground voltage. The charge pump is a voltage generation circuit separate from the operational amplifier. The operational amplifier uses the output voltage of the charge pump as the positive power supply or negative power supply for the operational amplifier. As a result, the output signal amplitude exceeding the power supply voltage or the output signal amplitude falling below the ground voltage can be obtained. However, this configuration has a disadvantage in that the charge pump which is a circuit separate from the operational amplifier is additionally required and the circuit scale is large.

In view of this, an object of the present invention is to provide a signal output circuit, an operational amplifier, and a charge pump circuit which are capable of obtaining output signal amplitude exceeding power supply voltage or output signal amplitude falling below ground voltage without requiring a voltage generation circuit which is a circuit separate from the operational amplifier.

CITATION LIST

Patent Literature

PTL 1: Japanese Patent Laid-Open No. H05-347519 (1993)

SUMMARY OF INVENTION

To achieve an object described above, a first aspect of the present invention provides a the signal output circuit including an operational amplifier including an amplification stage configured to amplify differential input voltage and an output stage configured to amplify an input signal amplified by the amplification stage and output the input signal as an output signal, wherein the output stage is a switched capacitor circuit comprising: switches; and a capacitor configured to sample differential voltage between input voltage outputted from the amplification stage and given voltage other than the input voltage, and wherein the switched capacitor circuit transfers the differential voltage sampled by the capacitor by switching of the switches based on the input voltage.

Moreover, the switches of the signal processing circuit of the present invention are transistors, and the switched capacitor circuit further includes control signal generating circuit which generates control signals for controlling the transistors, wherein control voltage of the control signals is based on voltage inputted into the switched capacitor circuit.

Furthermore, the switches of the signal processing circuit of the present invention are transistors, and the switched capacitor circuit further includes control signal generating circuit which generates control signals for controlling the transistors, wherein voltage of the control signals is based on voltage inputted into the switched capacitor circuit and voltage outputted from the switched capacitor circuit.

Moreover, another aspect of the present invention provides a charge pump circuit, outputting an output signal by inputting an input signal with first voltage to a semiconductor circuit having at least one transistor, the output signal having second voltage stepped up or stepped down from the first voltage, comprising: control signal generating circuit for generating a control signal so that the control signal of control voltage for on/off controlling the at least one transistor is based on the first voltage or the second voltage.

Another aspect of the present invention provides an operational amplifier including an output stage configured to output an input signal subjected to predetermined processing as an output signal, wherein the output stage is configured as a switched capacitor.

According to the present invention, since the output stage of the operational amplifier is configured as the switched capacitor output stage, it is possible to output output signal amplitude exceeding power supply voltage or output signal amplitude falling below ground voltage without separately generating positive or negative power supply voltage for the operational amplifier with a charge pump circuit or the like.

BRIEF DESCRIPTION OF DRAWINGS

FIG. 6 is a table illustrating operation states of the switched capacitor output stage of the operational amplifier illustrated in FIG. 3 and states of four switches included in the switched capacitor stage;

FIG. 12 is a table illustrating operation states of the switched capacitor output stage illustrated in FIG. 11 and states of four switches included in the switched capacitor stage;

DESCRIPTION OF EMBODIMENTS

First Embodiment

A first embodiment of the present invention is described based on FIGS. 3 to 9.

1. Circuit Configuration 1-1. Operational Amplifier 300

Figure 1:
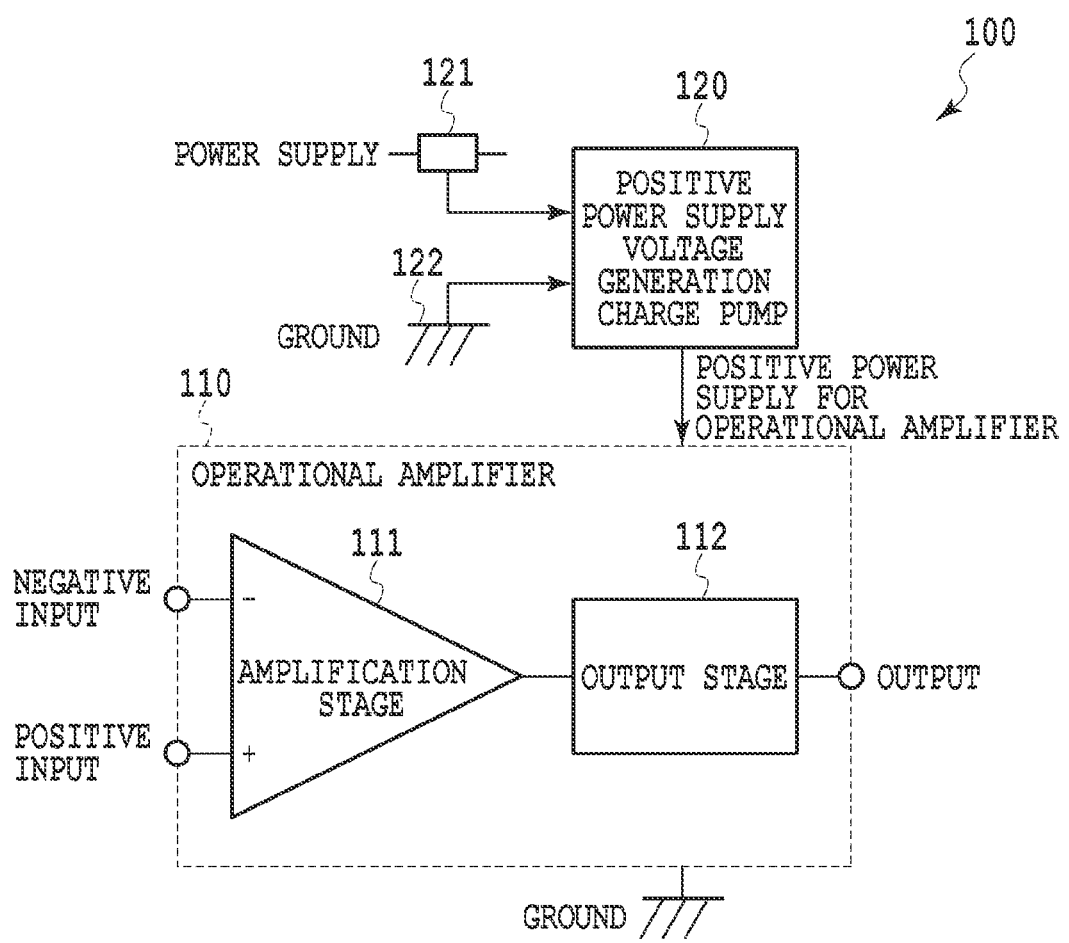
FIG. 1 is a block diagram illustrating an example of a conventional signal output circuit configured to output a signal exceeding power supply voltage.
Figure 2:
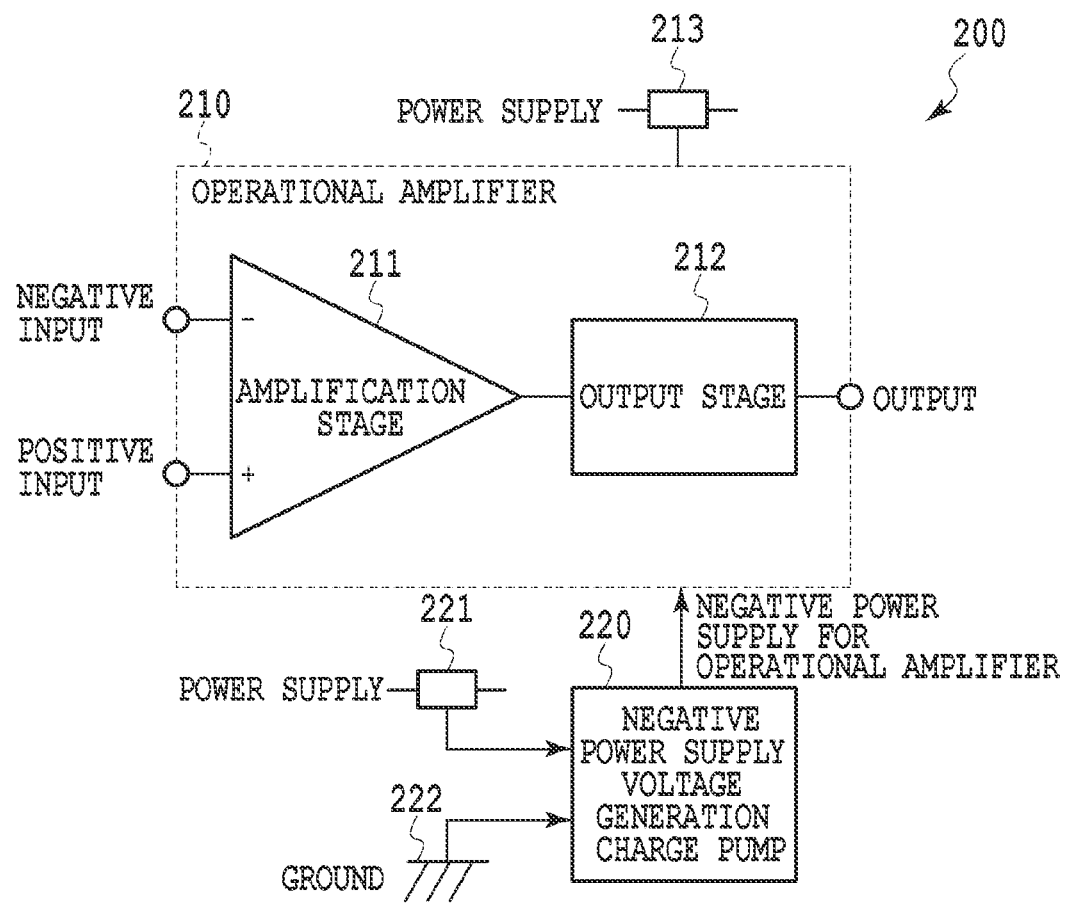
FIG. 2 is a block diagram illustrating an example of a conventional signal output circuit configured to output a signal falling below ground voltage.
Figure 3:
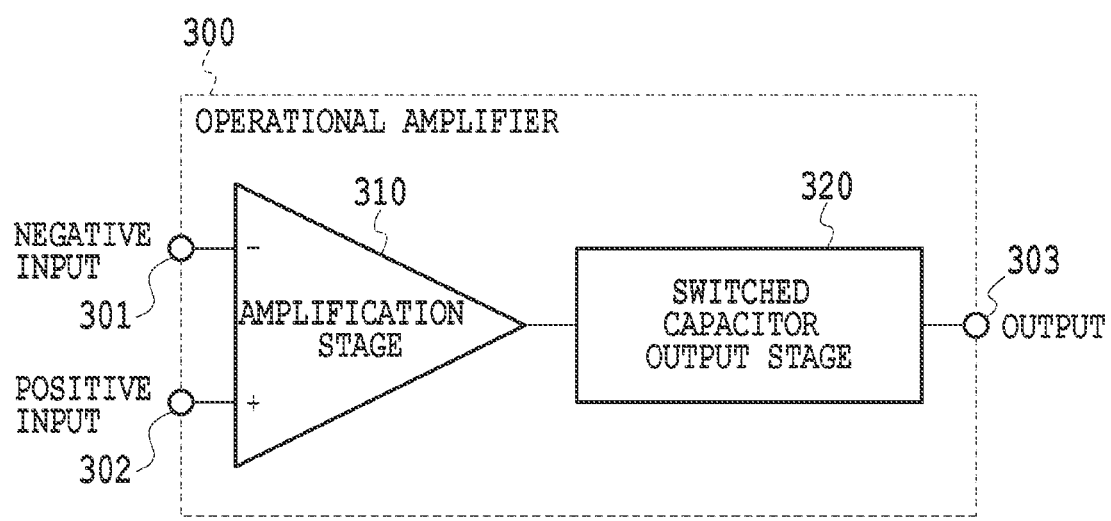
FIG. 3 is a block diagram illustrating a configuration of an operational amplifier in a first embodiment of the present invention.

FIG. 3 is a block diagram illustrating a configuration of an operational amplifier which is a signal output circuit in the first embodiment of the present invention.

The operational amplifier 300 illustrated in FIG. 3 includes an amplification stage 310 which is connected to multiple input terminals 301, 302 and a switched capacitor output stage 320 which is an output stage connected between the amplification stage 310 and an output terminal 303. The amplification stage 310 is an input stage of the operational amplifier 300 and may include a gain stage.

In this configuration, it can be said that the amplification stage 310 is a continuous signal circuit (continuous circuit) configured to transmit signals which are not quantized or sampled and that the switched capacitor output stage 320 is a discrete signal circuit configured to transmit signals which are not quantized but are sampled.

Moreover, the operational amplifier of the present invention is called class SC amplifier.

A current or voltage obtained by amplifying a differential input voltage with the amplification stage 310 is inputted to the switched capacitor output stage 320.

1-2. Amplification Stage 310

Figure 4:
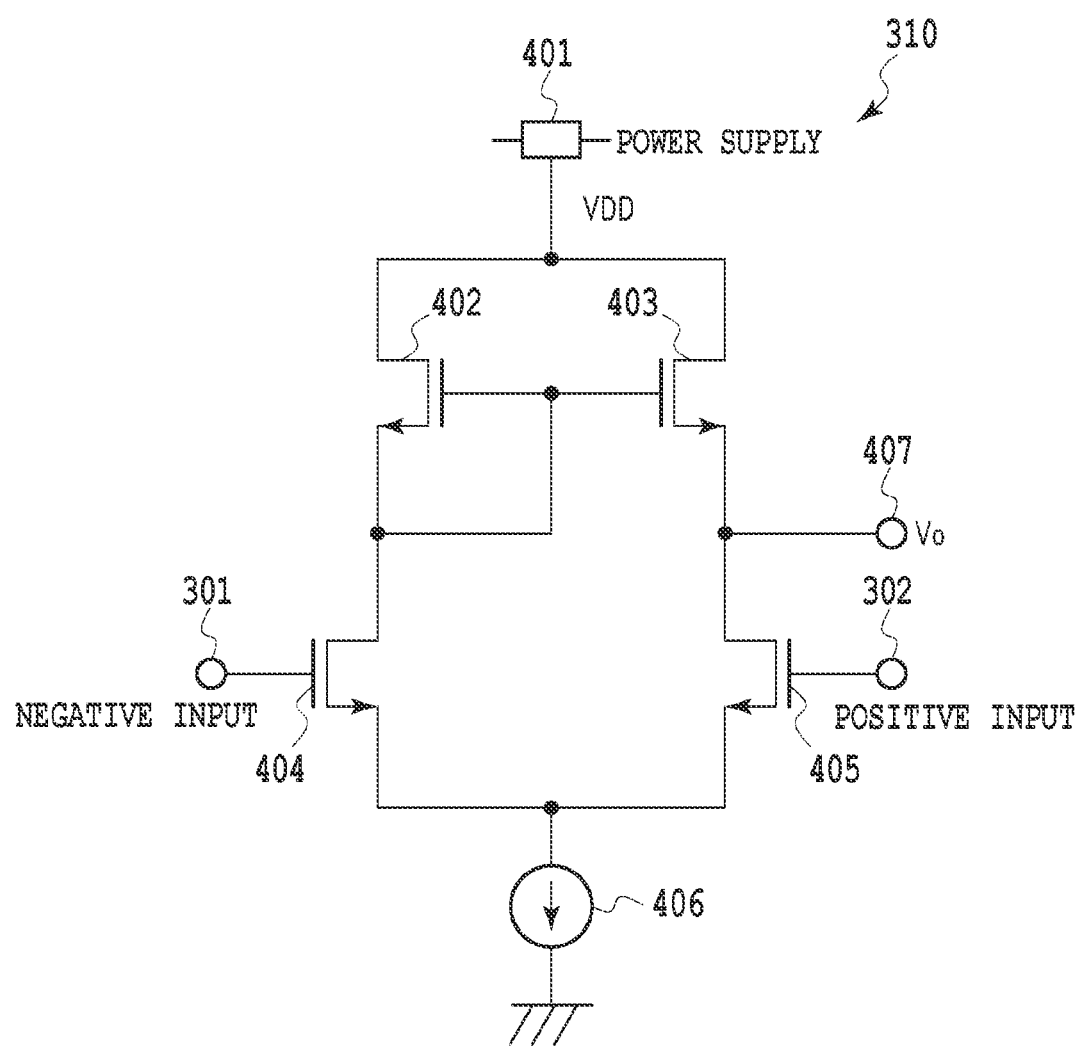
FIG. 4 is a circuit configuration diagram illustrating an amplification stage of the operational amplifier illustrated in FIG. 3.

FIG. 4 is a circuit configuration diagram illustrating the amplification stage 310 of the operational amplifier 300 illustrated in FIG. 3. The amplification stage 310 illustrated in FIG. 4 includes a power supply 401, transistors 402 and 403 whose drains are connected to the power supply 401, a transistor 404 whose drain is connected to a source of the transistor 402, a transistor 405 whose drain is connected to a source of the transistor 403, and a current source 406 connected to sources of the transistors 404 and 405. The transistors 404 and 405 form a differential pair, and a gate of the transistor 404 is connected to the input terminal 301 for negative input and a gate of the transistor 405 is connected to the input terminal 302 for positive input. Moreover, the source of the transistor 403 is connected to an output terminal 407. Reference sign VDD denotes power supply voltage of the power supply 401, and Vo denotes output voltage from the output terminal 407 to the output stage 320.

The circuit illustrated in FIG. 4 is an example of a circuit used as the amplification stage of the embodiment. However, the configuration of the amplification stage of the embodiment is not limited to the circuit configuration of the amplification stage for differential illustrated in FIG. 4, and various amplification stages such as a single-input amplification stage, a multi-stage amplification stage, and a cascade amplification stage can be applied. Moreover, the amplification stage 310 may include only the input stage or may further include a gain stage.

1-3. Switched Capacitor Output Stage 320

Figure 5:
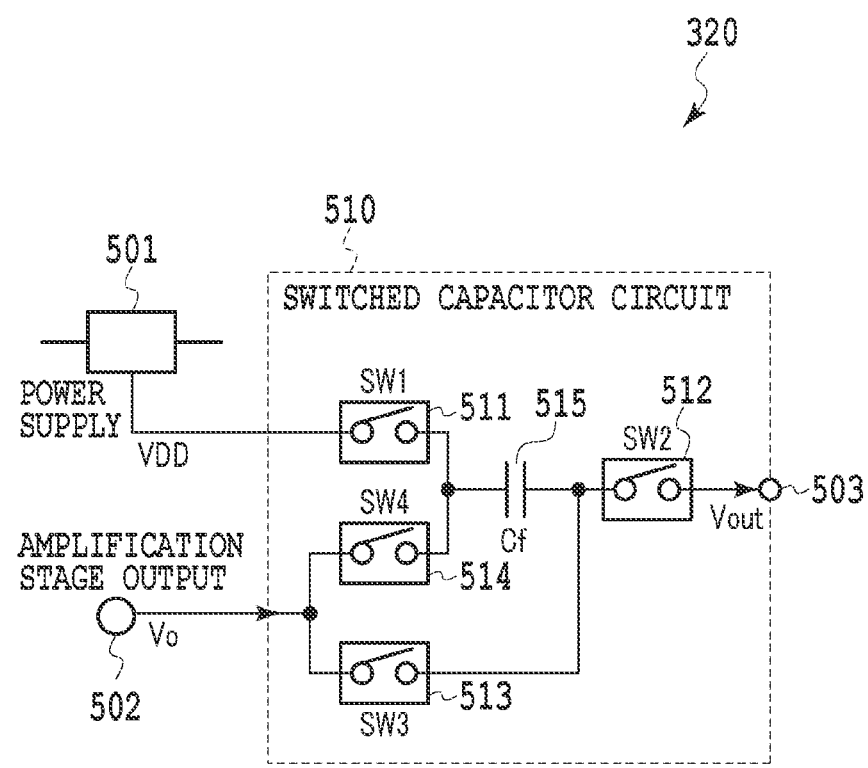
FIG. 5 is a circuit configuration diagram illustrating a switched capacitor output stage of the operational amplifier illustrated in FIG. 3.

FIG. 5 is a circuit configuration diagram illustrating the switched capacitor output stage 320 of the operational amplifier 300. The switched capacitor output stage 320 illustrated in FIG. 5 includes a switched capacitor circuit 510, a power supply 501 configured to provide voltage to the switched capacitor circuit 510, an input terminal 502 configured to supply the input voltage Vo to the switched capacitor circuit 510, and an output terminal 503 configured to output voltage Vout from the switched capacitor circuit 510.

The switched capacitor circuit 510 includes a switch 1 511 whose one end is connected to the power supply 501, a switch 2 512 whose one end is connected to the output terminal 503, a switch 3 513 and a switch 4 514 whose one ends are connected to the input terminal 502, and a flying capacitor 515 which is connected between the other end of the switch 2 512 and a set of the other ends of the switch 1 511 and the switch 4 514. The other end of the switch 2 512 and the other end of the switch 3 513 are connected to each other. Reference sign VDD denotes power supply voltage of the power supply 501, Vo denotes the output voltage of the amplification stage 310, and Vout denotes the output voltage of the operational amplifier 300.

FIG. 6 illustrates states of the switched capacitor output stage 320 illustrated in FIG. 5 and open-closed states of the respective switches. When the switched capacitor output stage 320 is in a sampling period, the switch 1 and switch 3 are turned ON and (Vo−VDD) which is differential voltage between the power supply voltage VDD and the output voltage Vo of the amplification stage 310 is sampled by the flying capacitor 515. At this time, the switch 2 and the switch 4 are set to an OFF state.

Next, when the switched capacitor output stage 320 is in a transfer period, the switch 2 and the switch 4 are turned ON and the switch 1 and the switch 3 are turned OFF. One terminal of the flying capacitor in which the potential is the power supply voltage VDD is connected to the output side of the amplification stage 310 by turning the switch 1 ON in the sampling period, and the voltage Vout at the output terminal 503 is set to (Vo−VDD)+Vo=2Vo−VDD.

Although the power supply voltage from the power supply 501 may be inputted to the switched capacitor output stage 320 in the embodiment, the supply of the voltage VDD is not only the power supply 501 but also ground voltage or constant voltage. Moreover, the voltage to be inputted may be supplied from an internal circuit or an external circuit.

The flying capacitor 515 may be incorporated in an IC or externally provided. In the present invention, the switched capacitor output stage 320 of the operational amplifier 300 requires no idling current. Moreover, the flying capacitor 515 does not have to transfer an unnecessary electric charge to the output of the operational amplifier 300. It only needs to be capable of transferring a minimum electric charge required to drive a load. Since the flying capacitor 515 can be incorporated in the IC by using the load of the operational amplifier 300, the number of external parts for the IC can be reduced.

Figure 7:
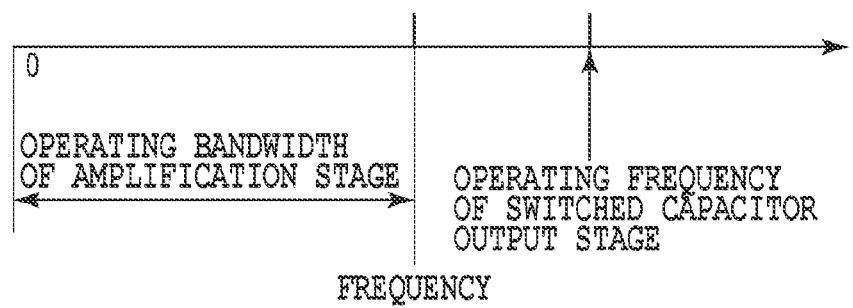
FIG. 7 is a graph illustrating relationships between an operating bandwidth of the amplification stage of the operational amplifier illustrated in FIG. 3 and an operating frequency of the switched capacitor output stage.

FIG. 7 illustrates relationships between an operating bandwidth of the amplification stage 310 configured to amplify a small potential difference between the positive input and the negative input of the operational amplifier 300 illustrated in FIG. 3 and an operating frequency of the switched capacitor output stage 320 configured to input the output of the amplification stage 310 and output a signal. As illustrated in FIG. 7, the operating bandwidth of the amplification stage and the operating frequency of the switched capacitor output stage are set such that the operating frequency of the switched capacitor output stage 320 is on a higher rate than the operating bandwidth of the amplification stage 310 in the frequency axis.

Figure 8:
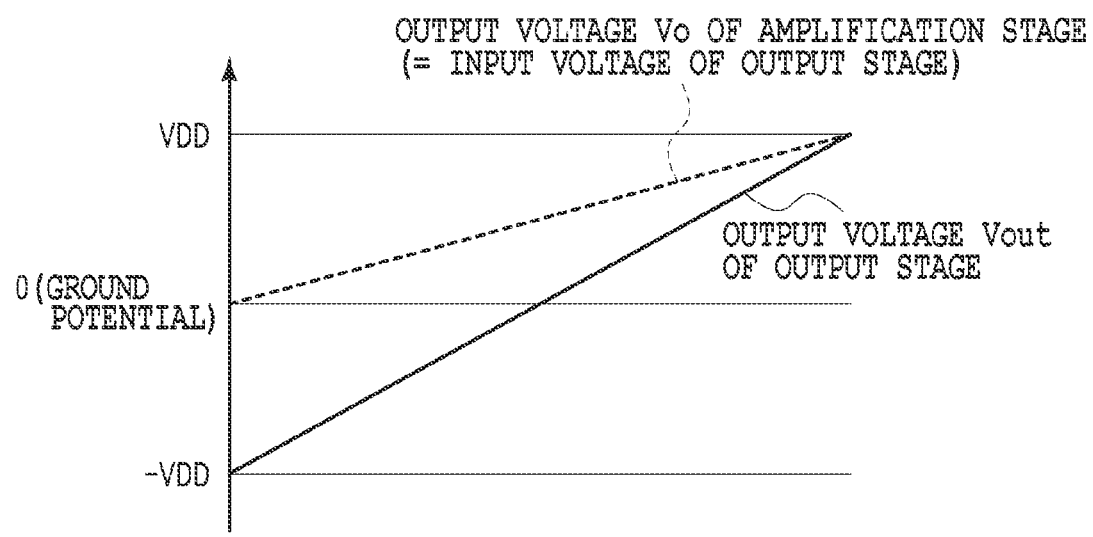
FIG. 8 is a graph illustrating relationships between input voltage of the switched capacitor output stage of the operational amplifier illustrated in FIG. 3 and output voltage of the switched capacitor output stage.

FIG. 8 illustrates relationships among Vout which is the output voltage of the operational amplifier 300 generated by the operation of the switched capacitor output stage 320 illustrated in FIG. 5, Vo which is the input voltage of the switched capacitor output stage 320, and VDD which is the power supply voltage. It is found that, since Vout=2Vo−VDD is satisfied, the voltage change of the output voltage Vout is twice the voltage change of the voltage Vo inputted to the switched capacitor circuit. Moreover, it is found that, since an output signal range extends from +VDD to −VDD, a negative signal can be outputted without the negative power supply voltage which is generated by the charge pump 220 being separate from the operational amplifier 210 and required in the conventional technique.

2. Equivalent Circuit

Figure 9:
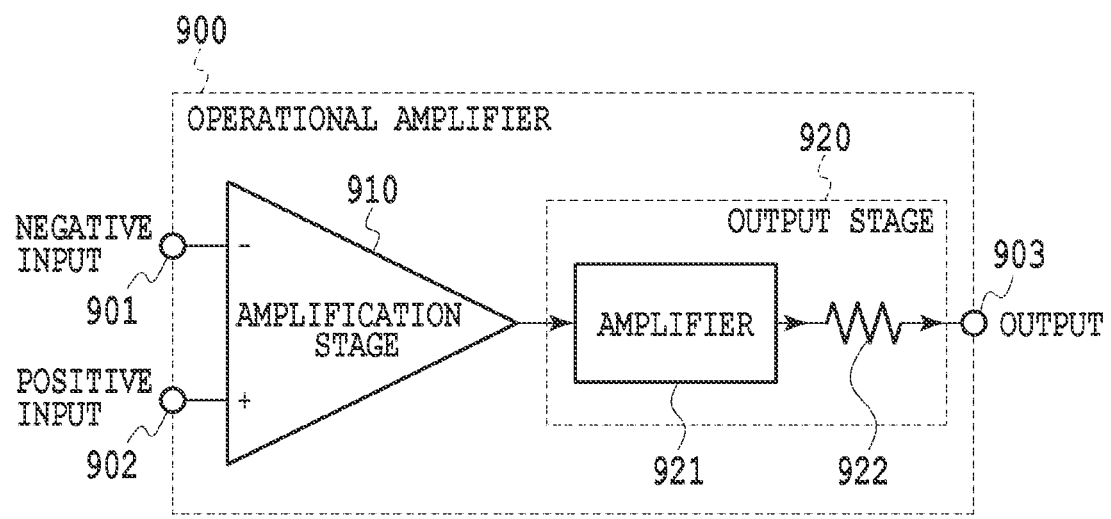
FIG. 9 is a block diagram illustrating an equivalent circuit of the switched capacitor output stage of the operational amplifier in the operating bandwidth of the amplification stage of the operational amplifier illustrated in FIG. 3.

FIG. 9 is a block diagram illustrating an equivalent circuit 900 of the operational amplifier 300 in the first embodiment of the present invention illustrated in FIG. 3 in a case where the operating bandwidth and the operating frequency are set as illustrated in FIG. 7. An output stage 920 illustrated in FIG. 9 operates at a higher rate than an operating bandwidth of an amplification stage 910. Since the switched capacitor output stage 320 illustrated in FIG. 5 generates the output voltage by doubling the input voltage Vo and reducing the doubled voltage by the power supply voltage VDD, the switched capacitor output stage 320 can be illustrated as an equivalent of a signal amplifier with an output resistance in which an output resistance 922 is attached to a doubling amplifier 921. The signal amplifier with the output resistance inputs an output signal of the amplification stage 910 as an input signal and outputs a signal based on the input signal.

The amplification factor of the amplifier 921 illustrated in FIG. 9 varies depending on whether the output stage 920 uses the output signal of the amplification stage 910 for sampling or transfer. When the output signal of the amplification stage 910 is used only for sampling, since the sampled output signal of the amplification stage 910 is transferred based on a certain voltage, the amplification factor of the amplifier 921 is one. When the output signal of the amplification stage 910 is used only for transfer, since the sampled voltage is transferred based on the output signal of the amplification stage 910, the amplification factor of the amplifier 921 is one also in this case. When the output signal of the amplification stage 910 is used for both of sampling and transfer, since the sampled output signal of the amplification stage 910 is transferred based on the output signal of the amplification stage 910 further, the amplification factor of the amplifier 921 is two.

The output resistance 922 illustrated in FIG. 9 is determined by the capacitance of a capacitor included in the switched capacitor output stage 920 and the operating frequency. A formula of Q=CV is satisfied, where Q is an electric charge to be sampled by the capacitor of the switched capacitor output stage 320, C is the capacitance of the capacitor, and V is voltage between two terminals of the capacitor. When both sides of this formula are differentiated by time t, dQ/dt=I=C×dV/dt is satisfied. Here, I indicates a current at which the switched capacitor output stage 320 transfers the signal to the output of the operational amplifier 300. Furthermore, R=V/I=V/(C×dV/dt)=1/C×dt=1/(C×fs) is satisfied, where R is the output resistance 722, and fs is the operating frequency of the switched capacitor output stage. The output resistance 822 can be considered as a resistance which is inversely proportional to the capacitance value of the capacitor included in the switched capacitor output stage 320 and the operating frequency.

When the switched capacitor output stage 320 illustrated in FIG. 5 is used as the output stage of the operational amplifier 300, the output of the operational amplifier 300 is Hi-Z in the sampling period illustrated in FIG. 6. Accordingly, a smoothing capacitor may be provided between the output of the operational amplifier 300 and the ground to hold the output voltage.

3. Application Example of First Embodiment

Figure 10:
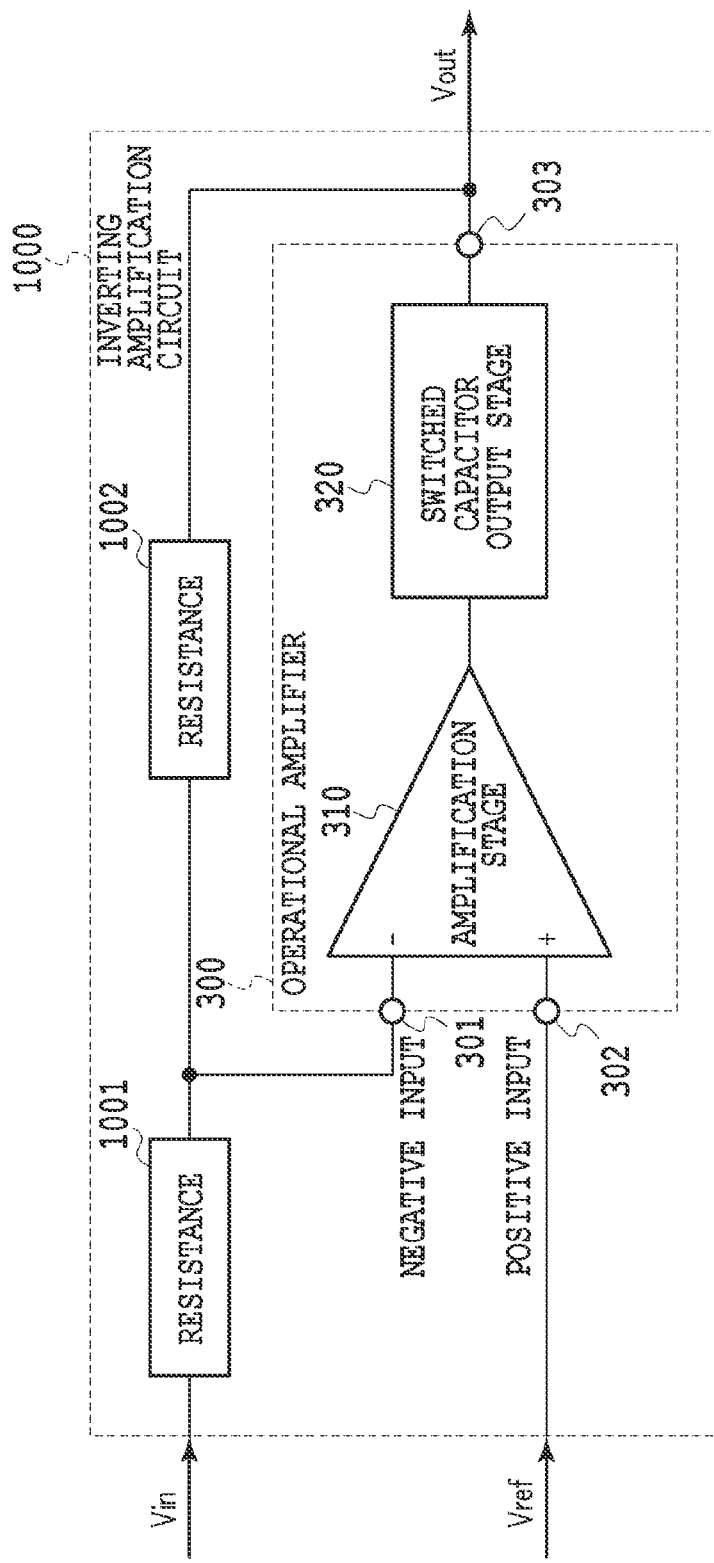
FIG. 10 is a block diagram illustrating a configuration of an inverting amplification circuit using the operational amplifier illustrated in FIG. 3.

FIG. 10 is a block diagram illustrating a configuration of an inverting amplification circuit 1000 using the operational amplifier 300 illustrated in FIG. 3.

The inverting amplification circuit 1000 amplifies Vin which is an input signal, on the basis of the ratio between a resistance 1001 and a resistance 1002, and outputs the amplified signal as Vout. Vref is reference voltage connected to the positive input terminal 302 of the operational amplifier 300. One terminal of the resistance 1001 and one terminal of the resistance 1002 are connected to the negative input terminal 301 of the operational amplifier. In the inverting amplification circuit 1000, there is formed a feedback loop which extends, via the resistance 1002 from the output terminal 303 of the switched capacitor output stage 320 to the negative input terminal 301 of the amplification stage 310. The output signal Vout is fed back to the input of the operational amplifier 300. In this configuration, feeding the output signal Vout back to the input terminal of the operational amplifier 300 can suppress components such as noise and distortion generated in the switched capacitor output stage 320 of the operational amplifier 300, in the amplification stage 310 which is the input stage.

Moreover, when there is a resistive load in the output of the operational amplifier 300, the output voltage of the operational amplifier 300 changes because a current flows through the load resistance. Here, as illustrated in FIG. 10, providing a feedback path (resistances 1001, 1002) between the output of the operational amplifier 300 and the negative input of the operational amplifier 300 causes the change in the output voltage of the operational amplifier 300 to be fed back and amplified in the amplification stage 310, and the feedback loop works in such a way that the change in the output voltage of the operational amplifier 300 is canceled out. Due to the work of the feedback loop, the same amount of electric charge as an electric charge flowing out from the load resistance is transferred by the switched capacitor output stage 320 to the output of the operational amplifier 300 in one cycle which is a combination of the sampling period and the transfer period of the switched capacitor output stage 320. Accordingly, constant voltage is outputted even when the resistive load exists at the output of the operational amplifier 300.

The circuit of FIG. 10 is an example in which the operational amplifier 300 is used in the inverting amplification circuit. However, the operational amplifier 300 can be applied to signal processing circuits using a various operational amplifier such as the inverting amplification circuit 1000 illustrated in FIG. 10, a normal amplification circuit (non-inverting amplification circuit), a differentiating circuit, an integrating circuit, a filter circuit, and a voltage follower circuit.

Note that the amplification stage 310 may output voltage or a current obtained by amplifying the differential input voltage, and the stage configuration thereof may be a configuration including one, two, three or more stages.

As described above, using the switched capacitor output stage 320 as the output stage of the operational amplifier 300 enables output of output signal amplitude exceeding the power supply voltage or output signal amplitude falling below the ground voltage without separately generating positive or negative power supply voltage for the operational amplifier with a charge pump circuit or the like.

Second Embodiment

Figure 11:
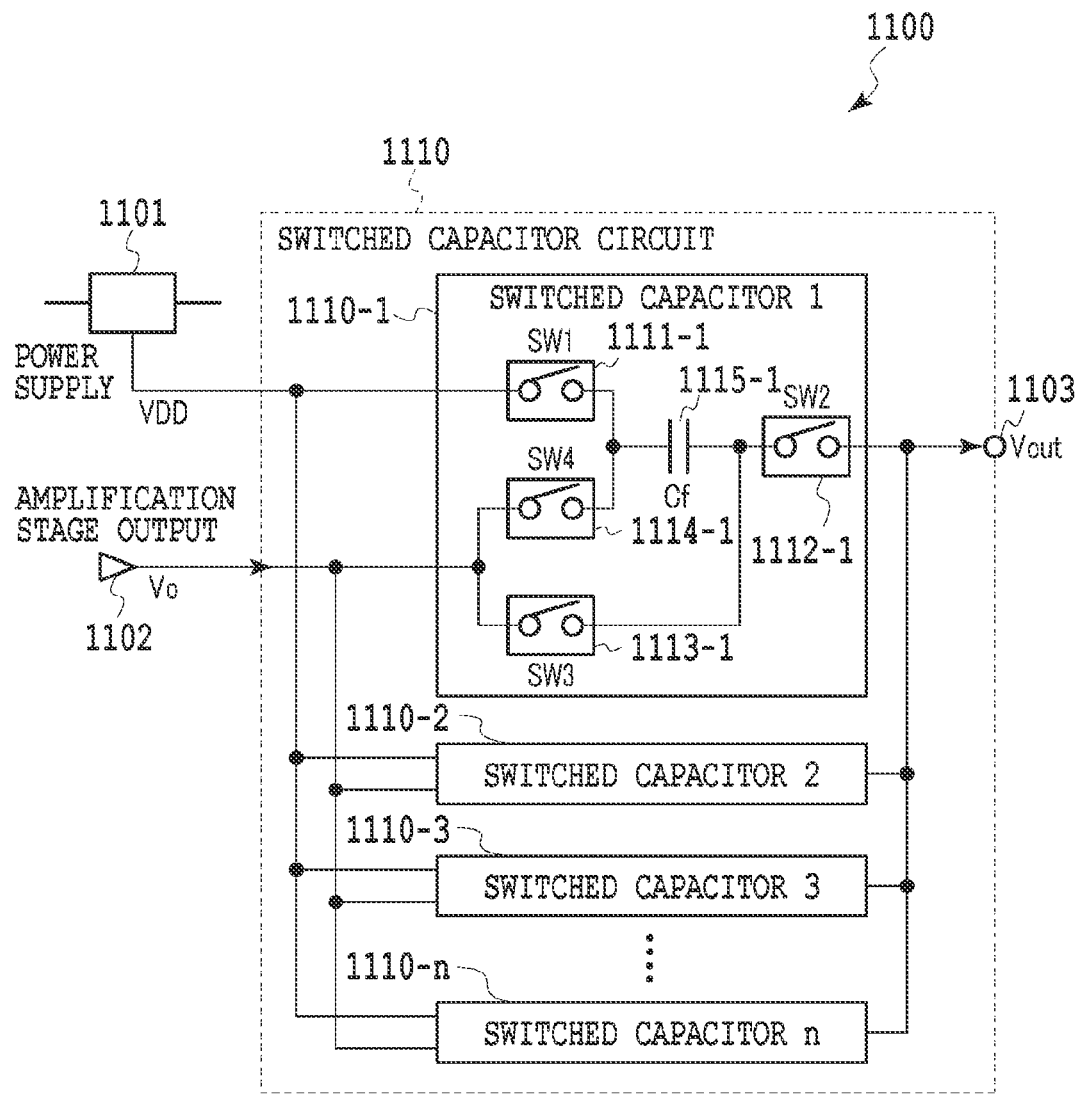
FIG. 11 is a block diagram illustrating a configuration of a switched capacitor output stage forming an operational amplifier in a second embodiment of the present invention.
Figure 12:
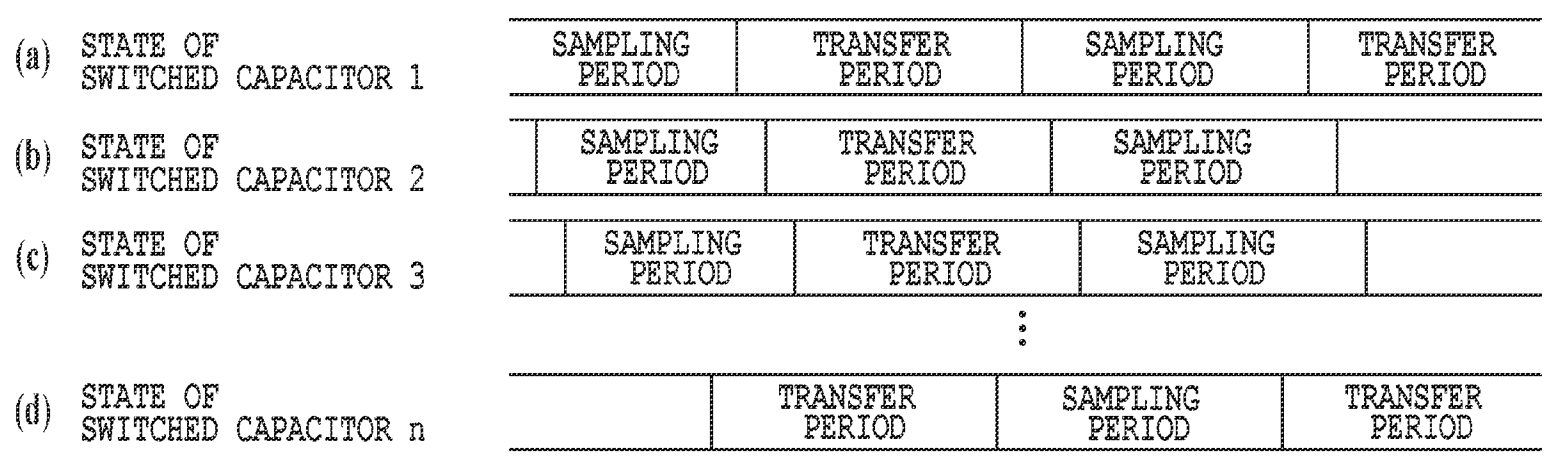

A second embodiment of the present invention is described based on FIGS. 11 and 12. An operational amplifier which is a signal output circuit in the embodiment is an operational amplifier including a switched capacitor output stage 1100 which is a modification of the switched capacitor output stage 320 forming the operational amplifier 300 illustrated in FIG. 3.

FIG. 11 is a circuit configuration diagram illustrating the switched capacitor output stage 1100 of the operational amplifier which is the signal output circuit in the embodiment. The switched capacitor output stage 1100 illustrated in FIG. 11 includes an integer number (integer number being two or more) of switched capacitors in parallel. Specifically, the switched capacitor output stage 1100 includes a switched capacitor circuit 1110 in which n (n is an integer of 2 or more) switched capacitor circuits of a switched capacitor 1 (1110-1), a switched capacitor 2 (1110-2), a switched capacitor 3 (1110-3), . . . , and switched capacitor n (**1110-*n***) are connected in parallel.

Each of the switched capacitors (1110-1 to **1110-*n*) is connected to a power supply 1101, an input terminal 1102, and an output terminal 1103. Here, the switched capacitor 1 includes a switch 1 1111-1 whose one end is connected to the power supply 1101, a switch 2 1112-1 whose one end is connected to the output terminal 1103, a switch 3 1113-1 and a switch 4 1114-1 whose one ends are connected to the input terminal 1102, and a flying capacitor 1115-1 which is connected between the other end of the switch 2 1112-1 and a set of the other ends of the switch 1 1111-1 and the switch 4 1114-1. The other end of the switch 2 1112-1 and the other end of the switch 3 1113-1 are connected to each other. Reference sign VDD denotes power supply voltage of the power supply 1101, Vo denotes output voltage of the amplification stage 310, and Vout denotes output voltage of the operational amplifier 300. The switched capacitors 1110-2 to 1110-*n* also have the same configuration as the switched capacitor 1110-1**.

The multiple switched capacitors 1 to n illustrated in FIG. 11 are each repeatedly set to a sampling period and a transfer period. When the switched capacitor 1 is in the sampling period, the switch 1 1111-1 and the switch 3 1113-1 are turned ON and (Vo-VDD) which is differential voltage between the power supply voltage VDD and the output voltage Vo of the amplification stage 310 is sampled by the flying capacitor 1115-1. At this time, the switch 2 1112-1 and the switch 4 1114-1 are set to an OFF state.

Next, when the switched capacitor 1 is in the transfer period, the switch 2 1112-1 and the switch 4 1114-1 are turned ON and the switch 1 1111-1 and the switch 3 1113-1 are turned OFF. One terminal of the flying capacitor in which the potential is the power supply voltage VDD is connected to the output of the amplification stage 310 by turning the switch 1 1111-1 ON in the sampling period, and the output voltage Vout is set to (Vo−VDD)+Vin=2Vo− VDD. The switched capacitors 1110-2 to 1110-n also perform the same operations as the switched capacitor 1110-1.

FIG. 12 illustrates the sampling period and the transfer period of each of the switched capacitors (1 to n).

As illustrated in FIG. 12, the sampling periods and the transfer periods of the switched capacitors (1 to n) are out of phase with one another and at least one switched capacitor is set to the transfer period at each of all time periods. Due to this switched capacitor set to the transfer period, the output of the operational amplifier 300 is not set to Hi-Z at each of all time periods. This switched capacitor then performs a role of transferring the sampled voltage to the output and a role of holding the output voltage.

As described above, forming the switched capacitor output stage 1110 including the multiple switched capacitor output stages 1110-1 to 1110-n connected in parallel allows the operational amplifier of the embodiment to output output signal amplitude exceeding the power supply voltage or output signal amplitude falling below the ground voltage without separately generating positive or negative power supply voltage for the operational amplifier with a charge pump circuit or the like.

Third Embodiment

Figure 13:
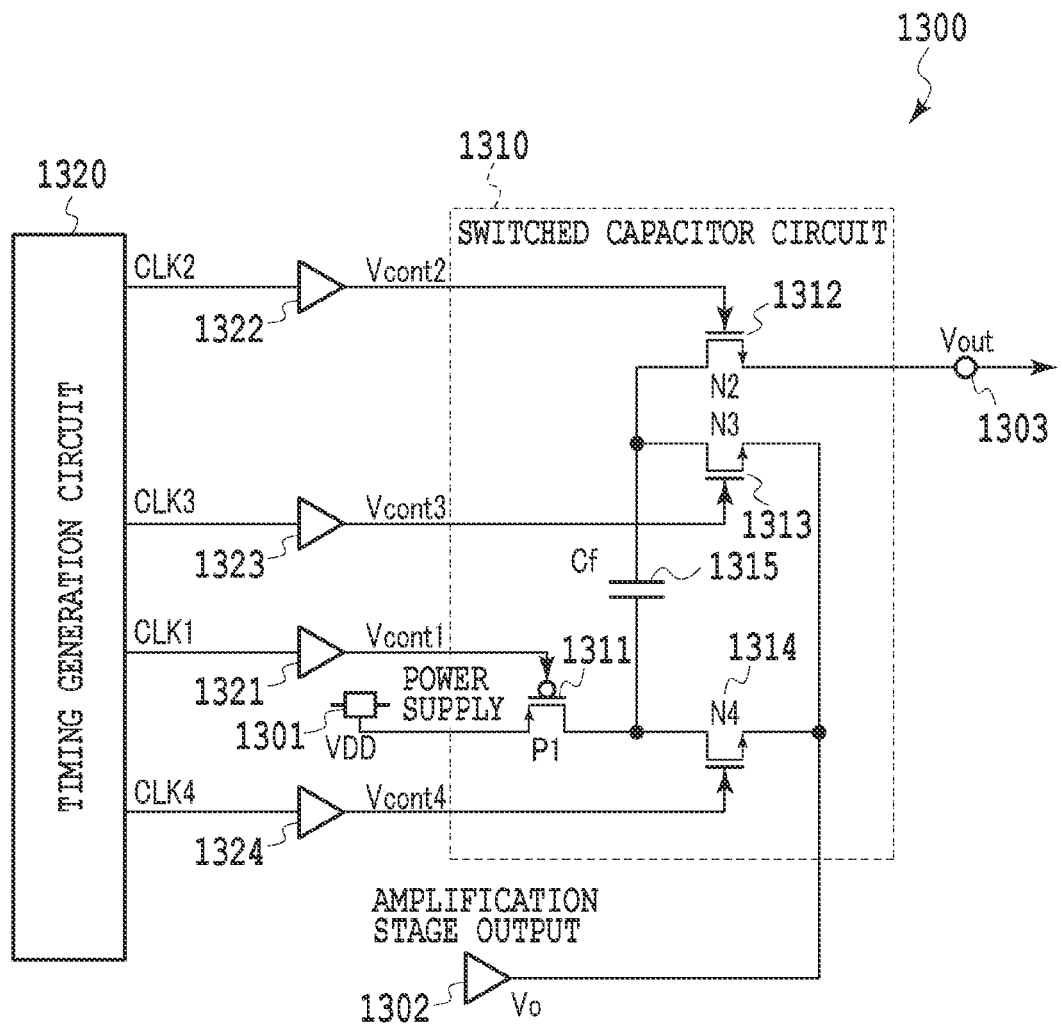
FIG. 13 is a block diagram illustrating a configuration of a switched capacitor output stage forming an operational amplifier in a third embodiment of the present invention.
Figure 14:
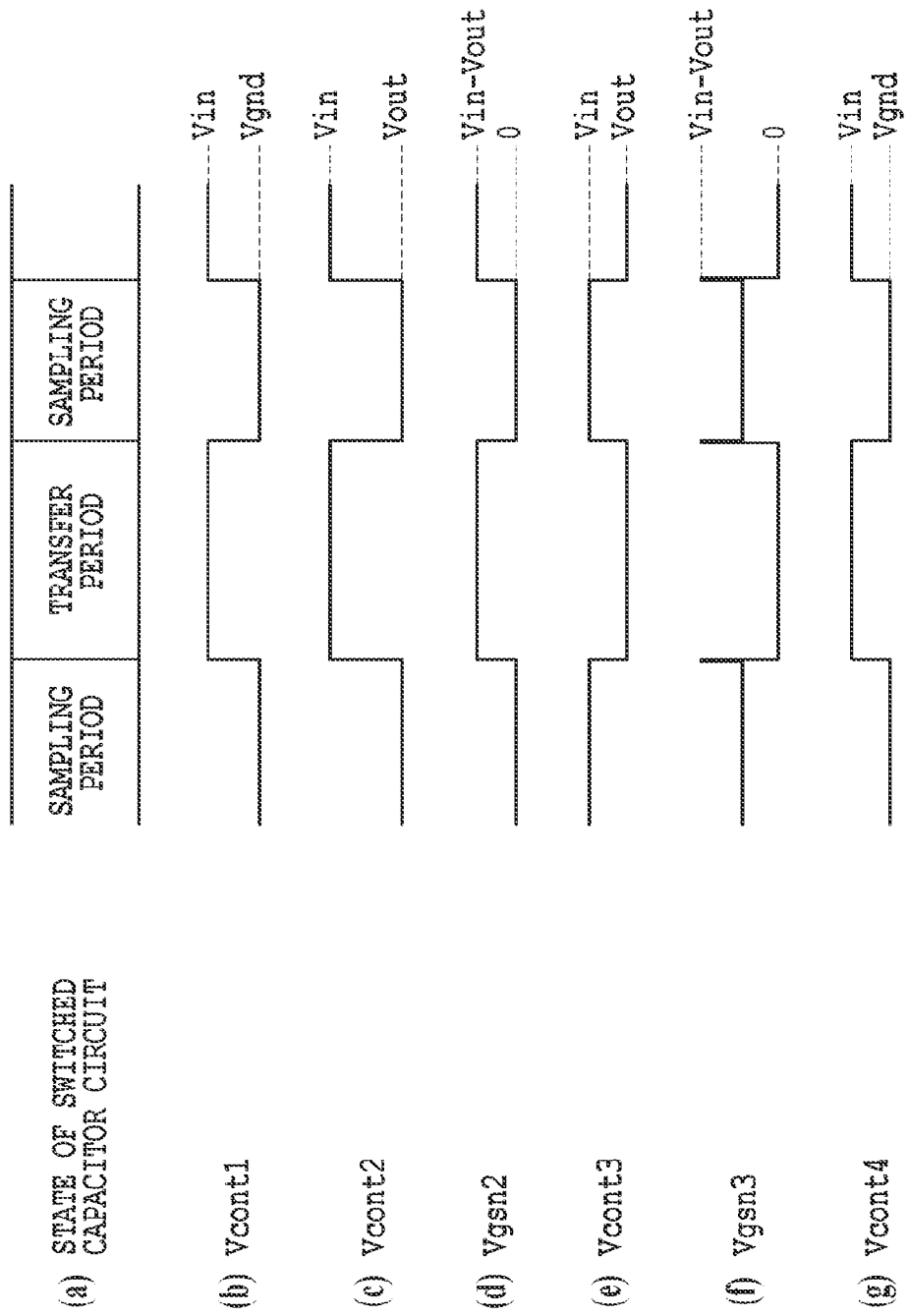
FIG. 14 is a table illustrating operation states of the switched capacitor output stage illustrated in FIG. 13 and states of four switches included in the switched capacitor stage.

A third embodiment of the present invention is described based on FIGS. 13 and 14. An operational amplifier which is a signal output circuit in the embodiment is an operational amplifier including a switched capacitor output stage 1300 which is a modification of the switched capacitor output stage 320 forming the operational amplifier 300 illustrated in FIG. 3.

1. Circuit Configuration of Switched Capacitor Output Stage 1300

FIG. 13 is a circuit configuration diagram illustrating the switched capacitor output stage 1300 of the operational amplifier which is a signal output circuit in the embodiment. The switched capacitor output stage 1300 of FIG. 13 is a specific circuit built as the switched capacitor output stage 320 forming the operational amplifier 300 of the first embodiment illustrated in FIG. 5.

The switched capacitor output stage 1300 illustrated in FIG. 13 includes a switched capacitor circuit 1310, a timing generation circuit 1320, and four buffers 1321, 1322, 1323, and 1324 configured to input CLK1, CLK2, CLK3, and CLK 4 which are output signals of the timing generation circuit 1320 and to output Vcont1, Vcont2, Vcont3, and Vcont4 which are four controls signals for the switched capacitor circuit 1310. The switched capacitor output stage 1300 further includes a power supply 1301 configured to supply power supply voltage VDD to the switched capacitor circuit 1310, an input terminal 1302 configured to input output voltage Vo outputted from an amplification stage to the switched capacitor circuit 1310, and an output terminal 1303 configured to output output voltage Vout from the switched capacitor circuit 1310.

In the switched capacitor out circuit 1310, the switch 1 511 which is one of the switches in FIG. 5 includes P1 1311 which is a P-type transistor, while the switch 2512, the switch 3 513, and the switch 4 514 which are the other three switches in FIG. 5 include of N2 1312 and N3 1313, and N4 1314 which are N-type transistors. In the switched capacitor circuit 1310, a source of the P-type transistor P1 1311 is connected to the power supply 1301 and a gate of the P-type transistor P1 1311 is connected to the buffer 1321; a source of the N-type transistor N2 1312 is connected to the output terminal 1303 and a gate of the N-type transistor N2 1312 is connected to the buffer 1322; a drain of the N-type transistor N3 1313 is connected to a drain of N2 1312 and a gate of the N-type transistor N3 1313 is connected to the buffer 1323; and a source of the N-type transistor N4 1314 is connected to a source of N3 1313 and a gate of the N-type transistor N4 1314 is connected to the buffer 1324. Moreover, the switched capacitor out circuit 1310 includes a flying capacitor 1315 connected between the drain of N2 1312 and the drain of N3 1313.

Vcont1, Vcont2, Vcont3, and Vcont4 which are the four control signals outputted from the buffer 1321 to 1324 are inputted to the gates of P1 1311, N2 1312, N3 1313, and N4 1314 which are the four switches, and ON control and OFF control of the switches is thus performed.

FIG. 14 is a table illustrating operation states of the switched capacitor output stage 1300 illustrated in FIG. 13. FIG. 14 illustrates specific voltage levels of the four control signals Vcont1, Vcont2, Vcont3, and Vcont4 depending on the state of the switched capacitor output stage 1300, and Vgsn2 and Vgsn3 which are voltage between the gates and sources of the two switches N2 1312 and N3 1313.

As illustrated in FIG. 14, a potential difference of (Vo−Vout) at most occurs between the gate and source of each of the two switches N2 1312 and N3 1313. Since the minimum value of Vout is −Vo, the potential difference of 2×Vo at most occurs between the gate and source of each of N2 1312 and N3 1313. Accordingly, the withstanding voltage between the gate and source of each of the two switches N2 1312 and N3 1313 of the switched capacitor output stage 1300 is preferably 2×Vo or more. In this case, since the transistors forming the circuit have withstanding voltage of 2×Vo or more, transistors with large gate oxide film thickness are preferably used. Moreover, since a transistor with large gate oxide film thickness has high resistance in the ON state, a transistor with a large size is preferably used to suppress a resistance value in the ON state to a certain level or lower.

Fourth Embodiment

A fourth embodiment of the present invention is described based on FIGS. 15 to 18. An operational amplifier which is a signal output circuit in the embodiment is an operational amplifier including a switched capacitor circuit 1510 which is a modification of the switched capacitor output circuit 320 forming the operational amplifier 300 illustrated in FIG. 3.

In the switched capacitor output stage 1300 illustrated in FIG. 13, requirements for the withstanding voltage between the gate and source are high for some transistors, and the circuit needs to be formed by using transistors with high withstanding voltage. Generally, a transistor with high withstanding voltage between the gate and source has large gate oxide film thickness and a high resistance value in the ON state. Accordingly, in order to suppress the resistance value in the ON state to a certain level or lower, the element size of the transistor needs to be increased. In view of this, in the embodiment, an operational amplifier having the same functions as that in the third embodiment is achieved by forming a switched capacitor circuit by using transistors with low withstanding voltage.

1. Switched Capacitor Output Stage 1500

Figure 15:
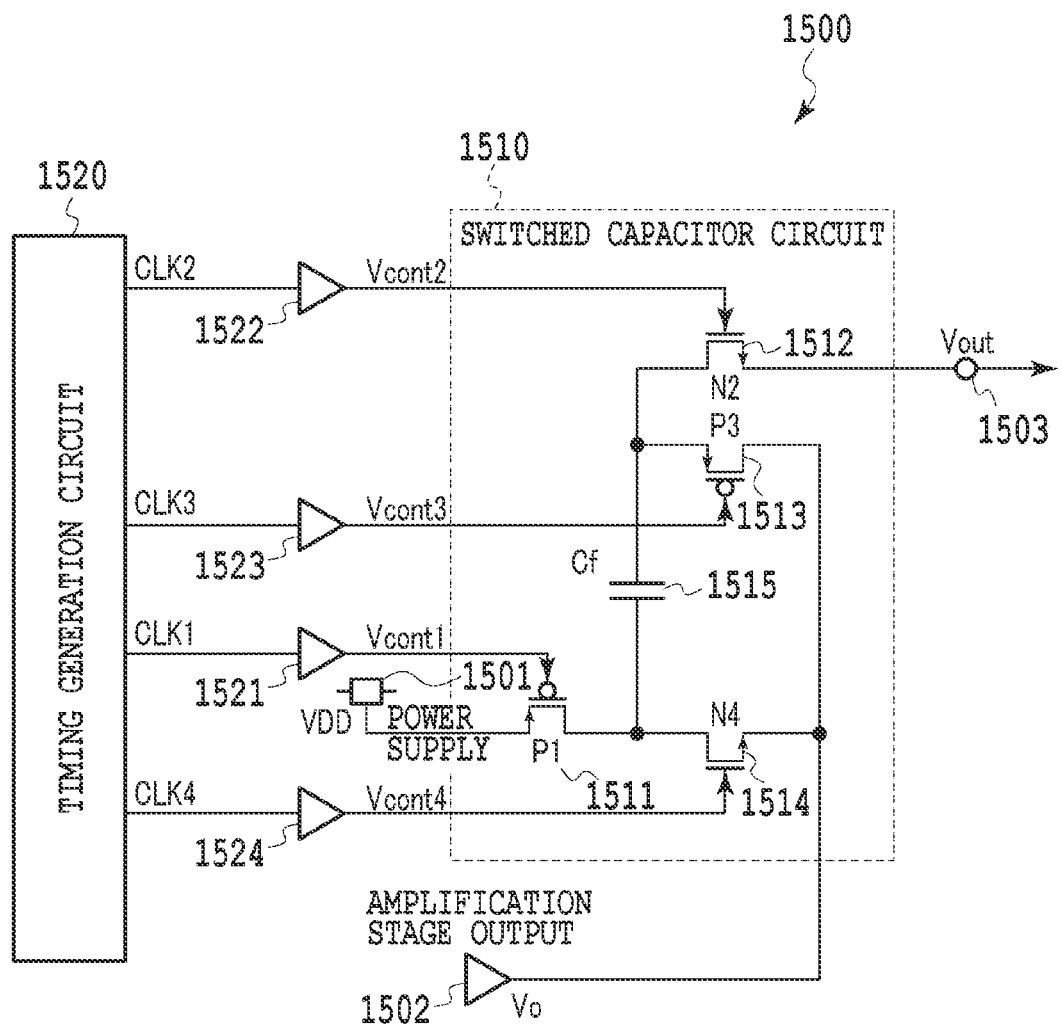
FIG. 15 is a block diagram illustrating a configuration of a switched capacitor output stage forming an operational amplifier in a fourth embodiment of the present invention.

FIG. 15 is a circuit configuration diagram illustrating the switched capacitor output stage 1500 of the operational amplifier which is a signal output circuit in the embodiment. The switched capacitor output stage 1500 of FIG. 15 is a specific circuit built as the switched capacitor output stage 320 forming the operational amplifier 300 of the first embodiment illustrated in FIG. 5.

The switched capacitor output stage 1500 illustrated in FIG. 15 includes a switched capacitor circuit 1510, a timing generation circuit 1520, and four buffers 1521, 1522, 1523, and 1524 configured to input CLK1, CLK2, CLK3, and CLK 4 which are output signals of the timing generation circuit 1520 and to output Vcont1, Vcont2, Vcont3, and Vcont4 which are four controls signals for the switched capacitor circuit 1510. The switched capacitor output stage 1500 further includes a power supply 1501 configured to supply power supply voltage VDD to the switched capacitor circuit 1510, an input terminal 1502 configured to input output voltage Vo outputted from an amplification stage to the switched capacitor circuit 1510, and an output terminal 1503 configured to output output voltage Vout from the switched capacitor circuit 1510.

In the switched capacitor circuit 1510, the switch 1 511 and switch 3 513 which are two of the switches in FIG. 5 includes P1 1511 and P3 1513 which are P-type transistors, while the switch 2 512 and the switch 4 514 which are the other two switches in FIG. 5 includes N2 1512 and N4 1514 which are N-type transistors.

In this configuration, a source of the P-type transistor P1 1511 is connected to the power supply 1501 and a gate of the P-type transistor P1 1511 is connected to the buffer 1521; a source of the N-type transistor N2 1512 is connected to the output terminal 1503 and a gate of the N-type transistor N2 1512 is connected to the buffer 1522; a source of the P-type transistor P3 1513 is connected to a drain of N2 1512 and a gate of the P-type transistor P3 1513 is connected to the buffer 1523; and a source of the N-type transistor N4 1514 is connected to a drain of P3 1513 and a gate of the N-type transistor N4 1514 is connected to the buffer 1524. Moreover, the switched capacitor circuit 1510 includes a flying capacitor 1515 connected between the drain of N4 1514 and the source of P3 1513.

A high level of the input signals CLK1, CLK2, CLK3, and CLK4 outputted from the timing generation circuit 1520 is VDD, a low level thereof is Vgnd, and the potential difference between the high level and the low level is VDD. The buffer 1521 outputs signal as Vcont1 and the buffer 1524 outputs signal as Vcont4. Low level (which is reference voltage of the signals) of the output signals are Vgnd and high level of the output signals are (Vgnd+VDD), and the potential difference between the high level of the output signals and the low level of the output signals is VDD. The buffer 1522 outputs signal as Vcont2 and the buffer 1523 outputs signal as Vcont3. Low level (which is reference voltage of the signals) of the output signals are Vout and high level of the output signals are (Vout+VDD), the potential difference between the high level of the output signals and the low level of the output signals is VDD. Vcont1, Vcont2, Vcont3, and Vcont 4 which are the four control signals are inputted to the gates of P1 1511, N2 1512, P3 1513, and N4 1514 which are the four switches, and ON control and OFF control of the switches is thus performed.

In the switched capacitor output stage 1500, a first transistor group (P1 1511, P1513) includes transistors of a first conductivity type (P type), and gives the flying capacitor 1515 an electric charge based on the input signal with first voltage (Vo). Meanwhile, a second transistor group (N2 1512, N4 1514) includes transistors of a second conductivity type (N type) different from the first conductivity type, and outputs the electric charge of the flying capacitor 1515 from the output terminal 1503.

The embodiment is characterized in that the switched capacitor output stage 1500 includes control signal generating circuit for generating control signals for ON/OFF control of the transistors N2 1512 and P3 1513 connected to the flying capacitor 1515 out of the transistors in the first and second transistor groups. Here, the control signals have control voltage is based on the power supply voltage VDD. The control signals can be generated by means of the buffers 1522 and 1523.

Moreover, the buffers 1521 and 1524 and, furthermore, the timing generation circuit 1520 connected to the buffers 1521 to 1524 are connected to the switched capacitor circuit 1510. The control signals can be generated by inputting the signals having voltage based on the ground voltage from the timing generation circuit 1520 to the buffers 1521 to 1524.

Figure 16:
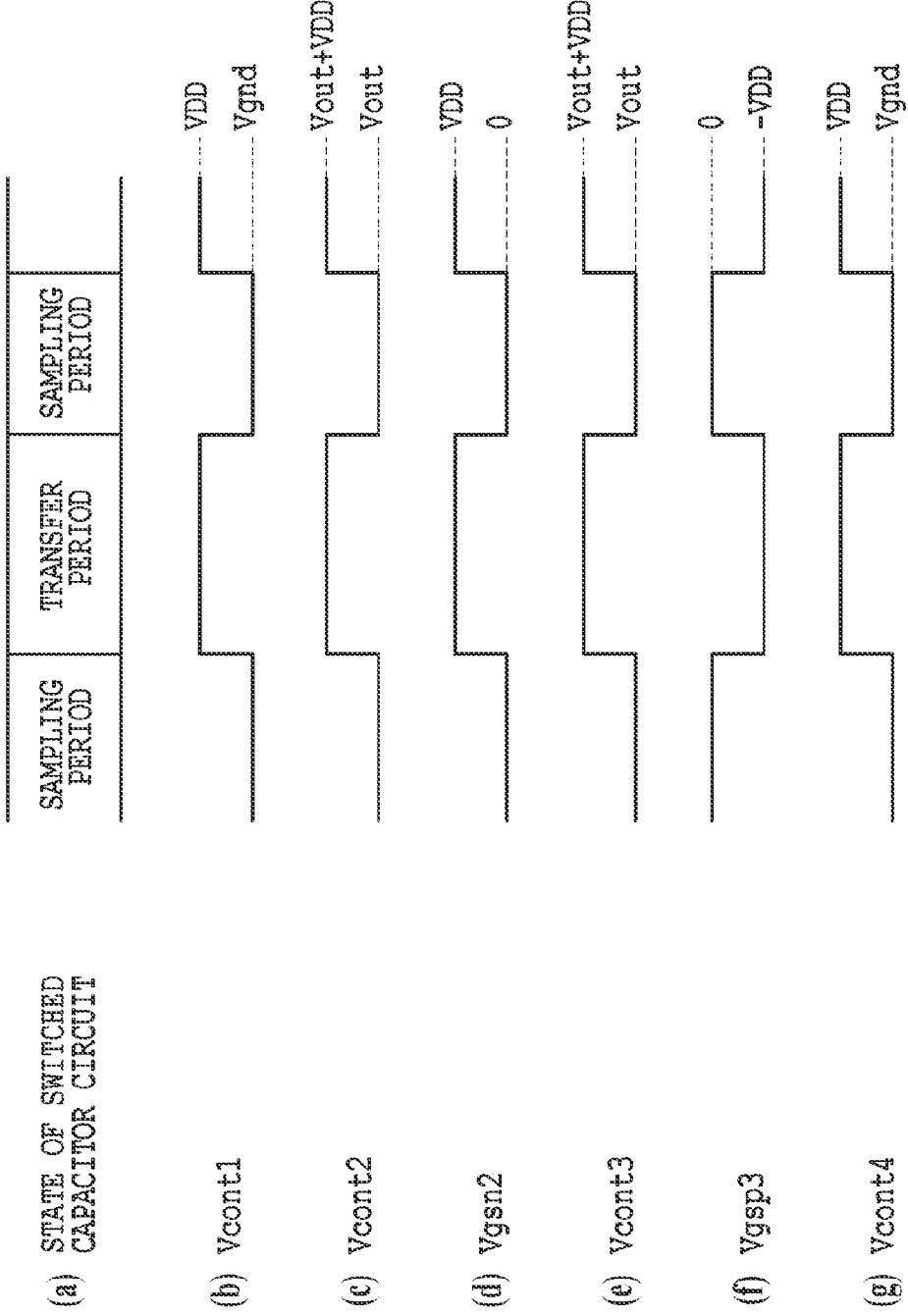
FIG. 16 is a table illustrating operation states of the switched capacitor output stage illustrated in FIG. 15 and states of four switches included in the switched capacitor stage.

FIG. 16 is a table illustrating operation states of the switched capacitor output stage 1500 in the embodiment illustrated in FIG. 15. FIG. 16 illustrates specific voltage levels of the four control signals Vcont1, Vcont2, Vcont3, and Vcont4 depending on the state of the switched capacitor output stage 1500, and Vgsp1, Vgsn2, Vgsp3, and Vgsn4 which are voltage between the gates and sources of the four switches P1 1511, N2 1512, P3 1513, and N4 1514.

As illustrated in FIG. 16, Vcont 2 and Vcont 3 which are gate voltage of the two switches N2 1512 and P3 1513 are generated based on the output voltage Vout of the switched capacitor output stage 1500, in both cases of performing ON control of the transistors and performing OFF control of the transistors. A potential difference of VDD at most is thus generated between the gate and source of each of N2 1512 and P3 1513. Accordingly, the withstanding voltage required between the gate and source of each of the four switches P1 1511, N2 1512, P3 1513, and N4 1514 of the switched capacitor output stage 1500 is VDD or less in this example.

As described above, the withstanding voltage required for each transistor in the embodiment is VDD or less, and a transistor with low withstanding voltage which has smaller gate oxide film thickness than that in the conventional techniques can be thus used. Hence, limits in manufacturing processes of the switched capacitor circuit are eliminated. Moreover, since a transistor with large gate oxide film thickness generally has high resistance in the ON state, a large transistor size is preferable to suppress the resistance value in the ON state to a certain level or lower. However, using this technique can reduce the transistor size and reduce the circuit scale.

2. Circuit Configuration of Buffer 1522 or Buffer 1523

In the switched capacitor output stage 1500, the reference of the control voltage of the control signals for ON/OFF control of the transistors N2 1512 and P3 1513 connected to the flying capacitor 1515 out of the transistors in the first and second transistor groups needs to be the power supply voltage VDD. Accordingly, in the embodiment, the buffer 1522 and the buffer 1523 are configured as follows.

2-1. First Configuration Example of Buffer

Figure 17:
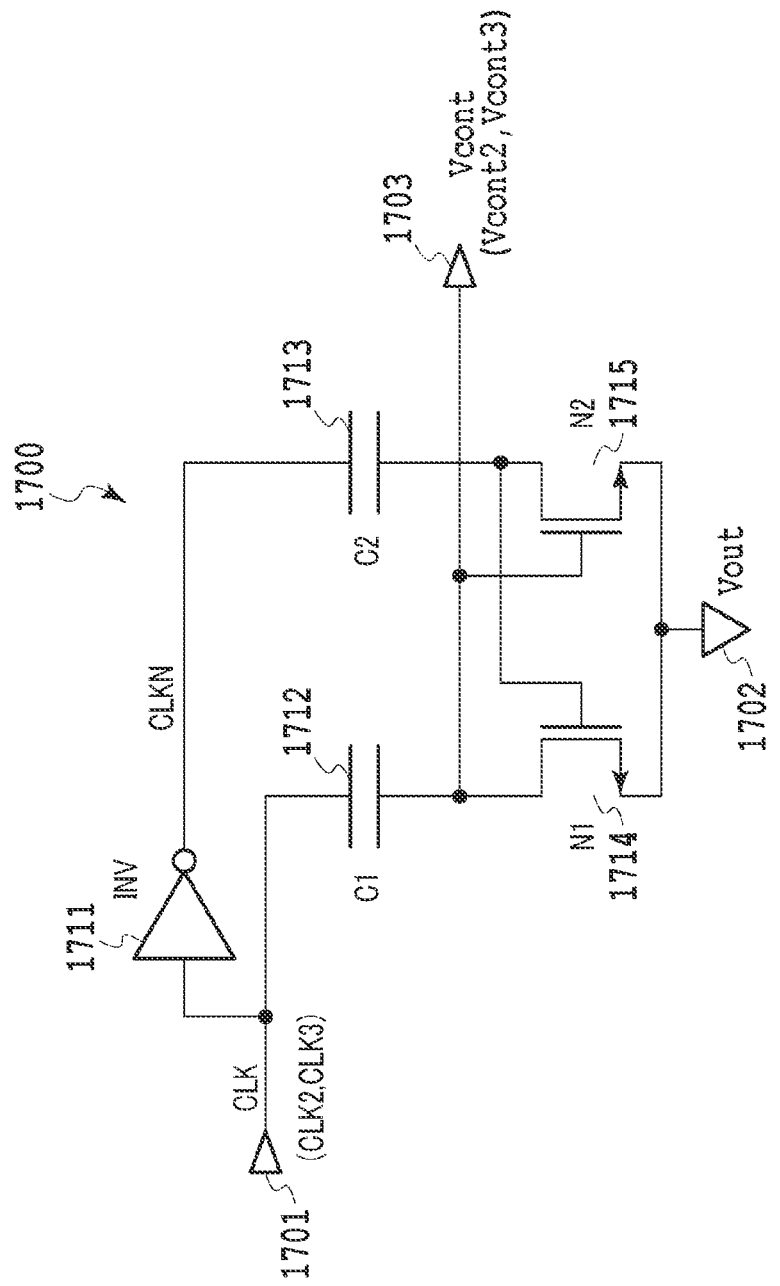
FIG. 17 is a circuit diagram illustrating a first configuration example of two buffers in a switched capacitor circuit illustrated in FIG. 15.

FIG. 17 is a circuit configuration diagram illustrating a configuration of a buffer 1700 which is an example of a specific circuit of the buffer 1522 or the buffer 1523 of the switched capacitor output stage 1500 illustrated in FIG. 15. The buffer 1700 of FIG. 17 includes an input terminal 1701 configured to input the output signal CLK2 (CLK3) from the timing generation circuit 1520, an output terminal 1702 configured to output the voltage Vout, and a control terminal 1703 configured to output the control signal Vcont2

(Vcont3). The buffer 1700 further includes an inverter 1711 whose input side is connected to the input terminal 1701, a capacitor 1712 whose one end is connected to the input terminal 1701 and the inverter 1711, and a capacitor 1713 whose one end is connected to an output terminal of the inverter 1711. The buffer 1700 also includes an N-type transistor 1714 and an N-type transistor 1715. A drain of the N-type transistor 1714 is connected to the other end of the capacitor 1712 and the control terminal 1703, a gate thereof is connected to the other end of the capacitor 1713, and a source thereof is connected to the output terminal 1702. A drain of the N-type transistor 1715 is connected to the other end of the capacitor 1713, the gate thereof is connected to the control terminal 1703, and the source thereof is connected to the output terminal 1702.

The buffer 1700 of FIG. 17 inputs CLK2 (CLK3) which is the output signal of the timing generation circuit 1520 of the switched capacitor output stage 1500 illustrated in FIG. 15, at the input terminal 1701, and outputs Vcont2 (Vcont3) which is gate voltage of the N-type transistor N2 1512 (P-type transistor P3 1513) of the switched capacitor output stage 1500, from the control terminal 1703. CLK is the input signal. The high level of CLK is VDD, the low level of CLK is Vgnd, and the potential difference between the high level and the low level of CLK is VDD. The inverter 1711 outputs CLKN which is an inverted signal of the input signal CLK. The high level of the CLKN is also VDD, the low level of CLKN is also Vgnd, and the potential difference between the high level and the low level of CLKN is also VDD. The capacitors 1712 and 1713 each shift CLK which is the input voltage or CLKN reference voltage.

In the buffer 1700, the low level of Vcont which is the output signal from the control terminal 1703 is set to Vout by turning ON the N-type transistor 1714, and the high level of Vcont is set to (Vout+VDD) which is voltage higher by VDD than Vout being the voltage at the time when the N-type transistor 1714 is ON. Accordingly, a signal based on Vout and in which the potential difference between the high level and the low level is VDD is outputted from the control terminal 1703 as Vcont.

3. Second Configuration Example of Buffer

Figure 18:
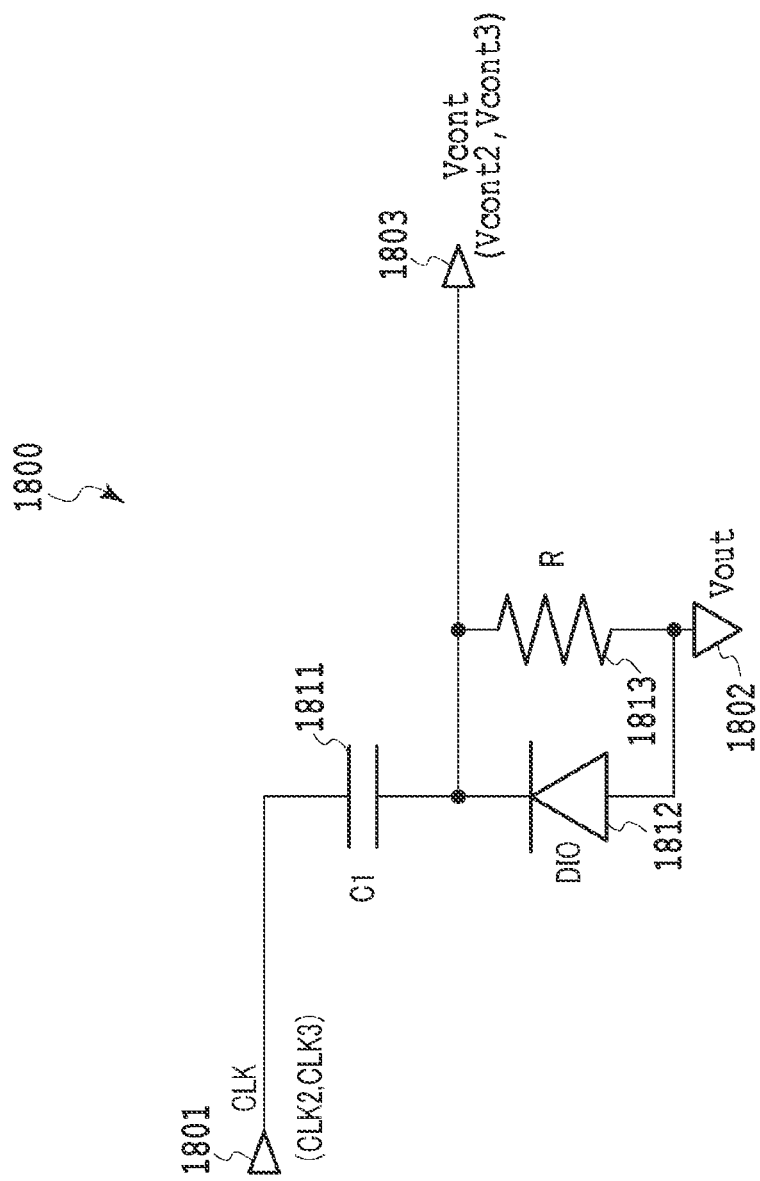
FIG. 18 is a circuit diagram illustrating a second configuration example of the two buffers in the switched capacitor circuit illustrated in FIG. 15.

FIG. 18 is a circuit configuration diagram illustrating a configuration of a buffer 1800 which is another example of a specific circuit of the buffer 1522 or the buffer 1523 in the switched capacitor output stage 1500 illustrated in FIG. 15. The buffer 1800 illustrated in FIG. 18 includes an input terminal 1801 configured to input the output signal CLK2 (CLK3) from the timing generation circuit 1520, an output terminal 1802 configured to output the voltage Vout, and a control terminal 1803 configured to output the control signal Vcont2 (Vcont3). The buffer 1800 further includes a capacitor 1811 whose one end is connected to the input terminal 1801 and whose other end is connected to the control terminal 1803, a diode 1812 whose cathode is connected to the other end of the capacitor 1811, and a resistance 1813 connected between the capacitor 1811 and the output terminal 1802.

The buffer 1800 of FIG. 18 inputs CLK2 (CLK3) which is the output signal of the timing generation circuit 1520 illustrated in FIG. 15, at the input terminal 1801, and outputs Vcont2 (Vcont3) which is gate voltage of the switched capacitor output stage 1500, from the control terminal 1803.

CLK is the input signal. The high level of CLK is VDD, the low level of CLK is Vgnd, and the potential difference between the high level and the low level of CLK is VDD. The capacitor 1811 shifts the reference voltage of the input signal CLK. An anode of the diode 1812 is connected to Vout which is output voltage of the switched capacitor output stage 1500 illustrated in FIG. 15, and the cathode of the diode 1812 is connected to Vcont which is the output signal. When Vcont is voltage lower than Vout, the diode 1812 allows a forward-direction current to flow.

In the buffer 1800, the low level of Vcont which is the output signal is set to Vout at which a current flows in the forward direction of the diode 1812, and the high level of Vcont is set to (Vout+VDD) which is voltage higher than Vout by VDD. Accordingly, a signal based on Vout and in which the potential difference between the high level and the low level is VDD is outputted from the control terminal 1803 as Vcont.

Note that, since the buffers 1521 and 1524 which are the two buffers illustrated in FIG. 15 can be formed of general buffers, description of specific configurations thereof is omitted herein. The buffers 1521 and 1524 each input CLK1 or CLK4 which is the output signal of the timing generation circuit 1520 illustrated in FIG. 15 and output Vcont1 or Vcont4 which is the gate voltage of the switched capacitor output stage 1500.

As described above, in the embodiment, in order to suppress the maximum potential difference between the gate and source of each of the transistors, the conductivity type of each of the transistors forming the switched capacitor output stage 1500 is appropriately set to P-type or N-type, and the gate control voltage of each transistor is generated based on the input signal or the output signal of the switched capacitor circuit, in both cases of performing ON control of the transistor and performing OFF control of the transistor. Furthermore, the maximum potential difference between the gate and source is thereby suppressed to VDD.

Accordingly, the switched capacitor circuit of the operational amplifier configured to output signals exceeding the power supply voltage or falling below than the ground voltage can be formed by using transistors with lower withstanding voltage than that in the conventional techniques. Therefore the circuit can be thus formed by using transistors with small gate oxide film thickness and low resistance in the ON state, and limits in manufacturing processes are reduced. At the same time, the transistor size required to suppress the resistance value in the ON state to a certain level or lower is smaller than that in the conventional techniques, and the scale of the semiconductor circuit configuration can be reduced.

Fifth Embodiment

The switched capacitor circuit forming the operational amplifier in the fourth embodiment can be applied to a charge pump circuit.

Figure 19:
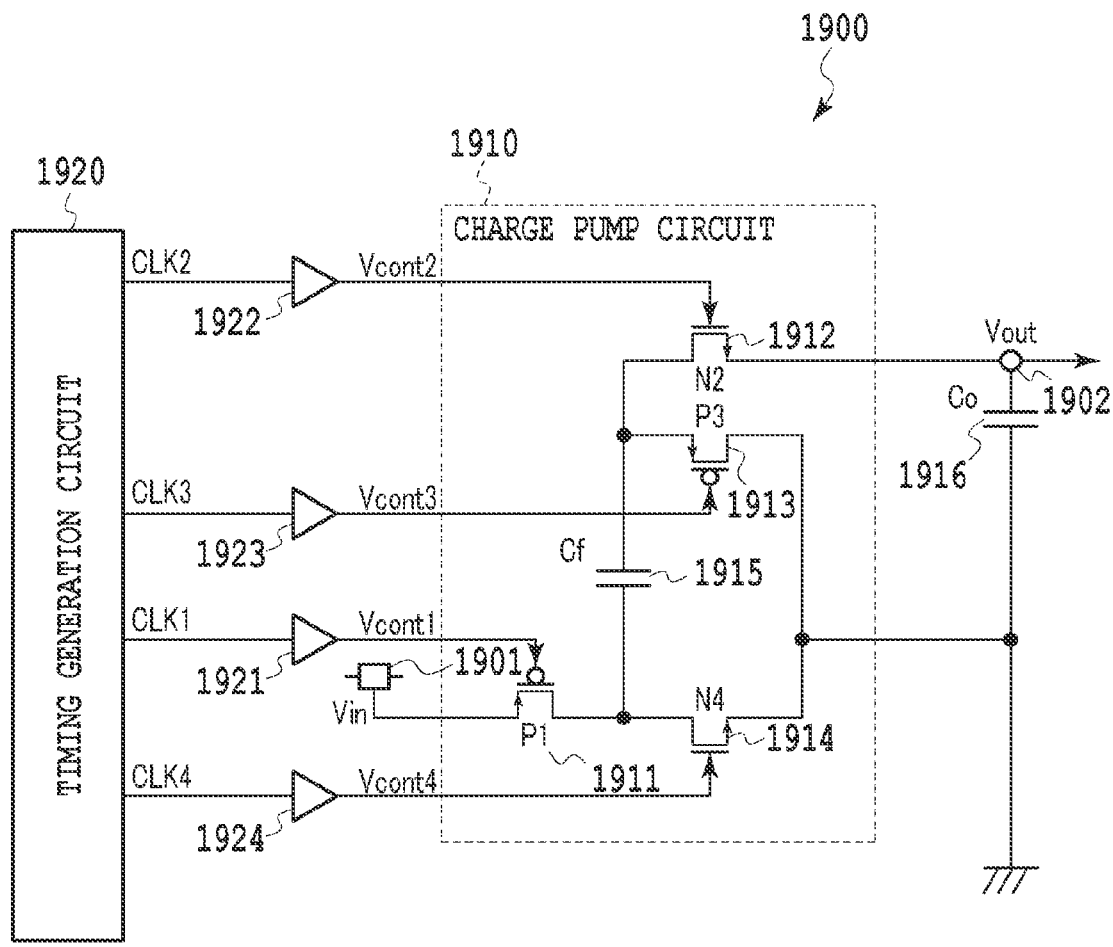
FIG. 19 is a block diagram illustrating a configuration of a switched capacitor output stage forming an operational amplifier in a fifth embodiment of the present invention.
Figure 20:
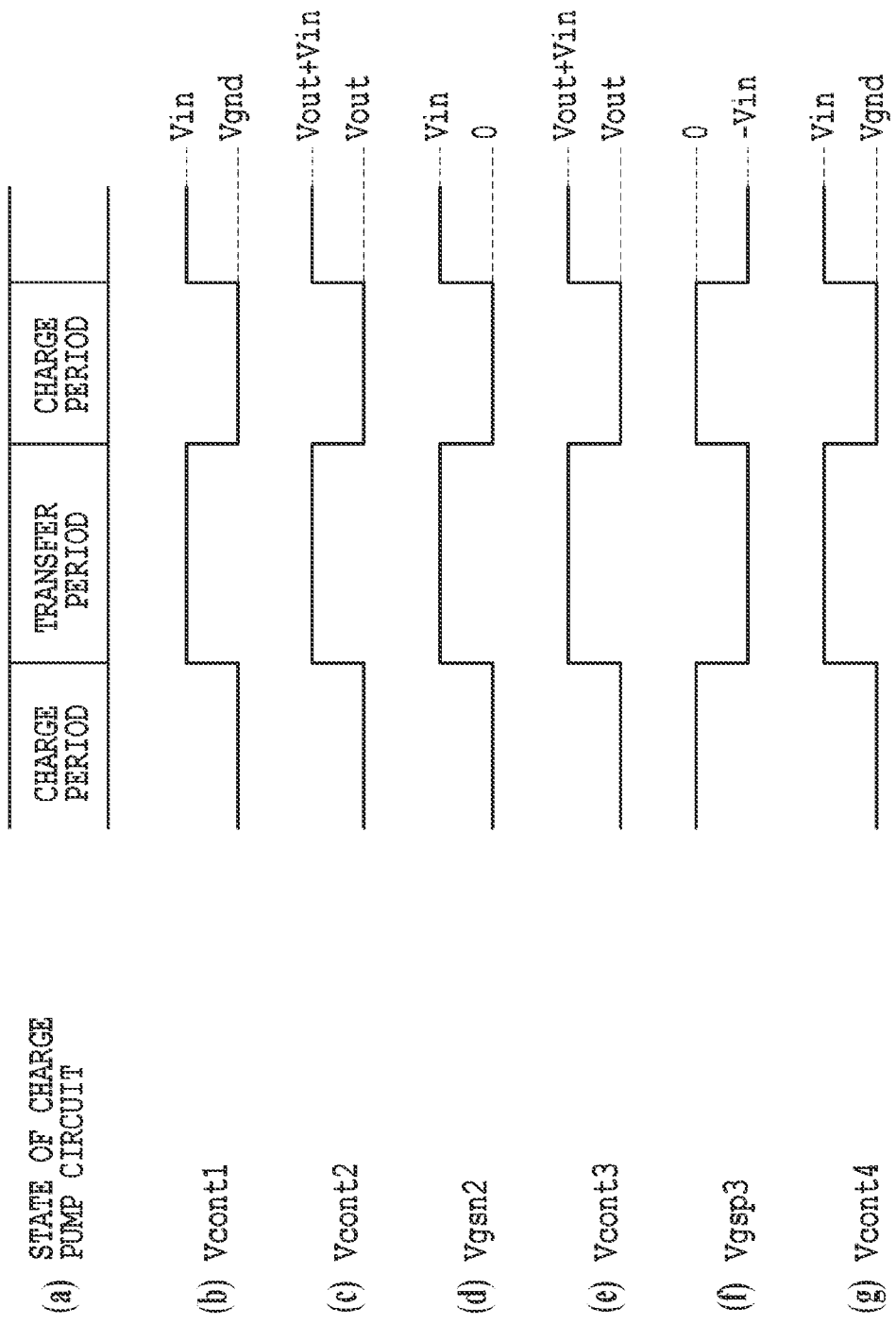
FIG. 20 is a table illustrating operation states of the switched capacitor output stage illustrated in FIG. 19 and states of four switches included in the switched capacitor stage.

The fifth embodiment of the present invention is described based on FIGS. 19 and 20. The charge pump circuit in the embodiment is a circuit in which the switched capacitor output stage 1500 forming the operational amplifier 300 and illustrated in FIG. 15 is applied to a charge pump.

FIG. 19 is a circuit configuration diagram illustrating a signal output circuit 1900 including the charge pump circuit in the embodiment. The signal output circuit 1900 of FIG. 19 includes a charge pump circuit 1910, a timing generation circuit 1920, and four buffers 1921, 1922, 1923, and 1924. The four buffers 1921, 1922, 1923, and 1924 are configured to input CLK1, CLK2, CLK3, and CLK 4 which are output signals of the timing generation circuit 1920 and to output Vcont1, Vcont2, Vcont3, and Vcont4 which are four controls signals for the charge pump circuit 1910. The signal output circuit 1900 further includes a power supply 1901 configured to supply power supply voltage VDD and an output terminal 1902 configured to output output voltage Vout from the charge pump circuit 1910.

In the charge pump circuit 1910, two switches of a switch 1 and a switch 3 are formed of P1 1911 and P3 1913 which are P-type transistors, and two switches of a switch 2 and a switch 4 are formed of N2 1912 and N4 1914 which are N-type transistors. A source of the P-type transistor P1 1911 is connected to the power supply 1901 and a gate of the P-type transistor P1 1911 is connected to the buffer 1921. A source of the N-type transistor N2 1912 is connected to the output terminal 1902 and a gate of the N-type transistor N2 1912 is connected to the buffer 1922. A source of the P-type transistor P3 1913 is connected to a drain of N2 1912 and a gate of the P-type transistor P3 1913 is connected to the buffer 1923. A source of the N-type transistor N4 1914 is connected to a drain of P3 1913 and a gate of the N-type transistor N4 1914 is connected to the buffer 1924.

The charge pump circuit 1910 also includes a flying capacitor 1915 connected between a drain of N4 1914 and the source of P3 1913 and a smoothing capacitor 1916 connected between the output terminal 1902 and the drain of P3 1913. Note that the drain of P3 1913, the source of N4 1914, and one end of the smoothing capacitor 1916 are grounded.

CLK1, CLK2, CLK3, and CLK4 are input signals. A high level of the input signals is Vin, a low level of the input signals is Vgnd, and the potential difference between the high level and the low level of the input signals is Vin. The buffer 1921 outputs signal as Vcont1 and the buffers 1924 output signal as Vcont4 Low level (which is reference voltage of the signals) of the output signals are Vgnd and high level of the output signals are (Vgnd+Vin), and the potential difference between the high level of the output signals and the low level of the output signals is Vin. The buffer 1922 outputs signal as Vcont2 and the buffer 1923 outputs signal as Vcont3 Low level (which is reference voltage of the signals) of the output signals are Vout and high level of the output signals are (Vout+Vin), the potential difference between the high level of the output signals and the low level of the output signals is Vin. Vcont1, Vcont2, Vcont3, and Vcont 4 which are the four control signals are inputted to the gates of P1 1911, N2 1912, P3 1913, and N4 1914 which are the four switches, and ON control and OFF control of the switches is thus performed.

In the signal output circuit 1900, a first transistor group (P1 1911, P1913) includes transistors of a first conductivity type (P type), and gives the flying capacitor 1915 an electric charge based on the supply voltage (VDD). Meanwhile, a second transistor group (N2 1912, N4 1914) includes transistors of a second conductivity type (N type) different from the first conductivity type, and redistributes the electric charge of the flying capacitor 1915 to the flying capacitor 1915 and the smoothing capacitor 1916. The charge pump circuit 1910 steps up or steps down the power supply voltage (VDD) and outputs an output signal (Vout).

The embodiment is characterized in that the signal output circuit 1900 includes control signal generating circuit for generating control signals so that, in the charge pump circuit 1910, the control signal for on/off controlling of the transistors in the first and second transistor groups connected to the flying capacitor 1915 is based on the first voltage or second voltage. The control signal generating circuit can be formed of the buffers 1922 and 1923 configured to generate the control signal.

Moreover, in the charge pump circuit 1910, the control signals can be generated by inputting the signals having voltage based on the ground voltage, from the timing generation circuit 1920 to the buffers 1921 to 1924.

FIG. 20 illustrates specific voltage levels of the four control signals Vcont1, Vcont2, Vcont3, and Vcont4 for the state of the charge pump circuit 1910 in the example illustrated in FIG. 19, and Vgsp1, Vgsn2, Vgsp3, and Vgsn4 which are voltage between the gates and sources of the four switches P1 1911, N2 1912, P3 1913, and N4 1914.

As illustrated in FIG. 17, Vcont 2 and Vcont 3 which are gate voltage of the two switches N2 1912 and P3 1913 are generated based on the output voltage Vout of the charge pump circuit, in both cases of performing ON control of the transistors and performing OFF control of the transistors. A potential difference of Vin at most is thus generated between the gate and source of each of N2 1912 and P3 1913. Accordingly, the withstanding voltage required between the gate and source of each of the four switches P1 1911 to N4 1914 of the charge pump circuit 1910 in this embodiment is Vin or greater.

The withstanding voltage required for each of the transistors forming the circuit in the conventional techniques is 2×Vin or higher, while the withstanding voltage required for each of the transistors in the embodiment is Vin or higher. Accordingly, a transistor with low withstanding voltage which has smaller gate oxide film thickness than that in the conventional techniques can be used. Hence, limits in manufacturing processes of the switched capacitor circuit are eliminated. Moreover, since a transistor with large gate oxide film thickness generally has higher resistance in the ON state. Accordingly, the transistor needs to be large in size to suppress the resistance value to a certain level or lower in the ON state, and a circuit scale is large. However, since the transistor size can be reduced by using the technique described above, the circuit scale can be reduced.

Note that, since the buffers 1921 and 1924 can be formed of general buffers, description on specific configurations thereof is omitted herein. Since the two buffers 1922 and 1923 illustrated in FIG. 16 are the same as the buffers in FIGS. 17 and 18, description on specific configuration of each of the buffers is omitted.

As described above, in the example, in order to suppress the maximum potential difference between the gate and source of each of the transistors, the conductivity type of each of the transistors forming the charge pump circuit 1910 is appropriately set to P-type or N-type. Moreover, the gate control voltage of each transistor is generated based on the output signal Vout or the input signal Vo of the switched capacitor circuit, in both cases of performing ON control of the transistor and OFF control of the transistor. The maximum potential difference between the gate and source is thereby suppressed to Vo.

Accordingly, the charge pump circuit configured to output signals exceeding the power supply voltage or falling below the ground voltage can be formed by using transistors with lower withstanding voltage than that in the conventional techniques. The circuit can be thus formed by using transistors with small gate oxide film thickness and low resistance in the ON state. Limits in manufacturing processes are thus reduced. At the same time, the transistor size required to suppress the resistance value in the ON state to a certain level or lower is smaller than that in the conventional techniques, and the scale of the semiconductor circuit configuration can be reduced.

REFERENCE SIGNS LIST 100, 200 signal output circuit
110, 210, 300, 900 operational amplifier 111, 211, 310, 910 amplification stage
112, 212, 920 output stage
120, 220, 1910 charge pump circuit
121, 221, 131, 401, 501, 1101, 1301, 1501, 1901 power supply
122, 222 ground
301, 302, 502, 901, 902, 903, 1102, 1302, 1502, 1701, 1801 input terminal
303, 407, 503, 1103, 1303, 1503, 1702, 1802, 1902 output terminal
320, 1100, 1300, 1500 switched capacitor output stage
402 to 405, 1311 to 1314, 1511 to 1514, 1714, 1715, 1911 to 1914 transistor
406 current source
510, 1110, 1110-1 to 1110-$n$, 1310, 1510 switched capacitor circuit
511 to 514, 1111-1 to 1111-$n$, 1112-1 to 1112-$n$, 1113-1 to 1113-$n$, 1114-1 to 1114-$n$ switch
515, 1115-1 to 1115-$n$, 1315, 1515, 1712, 1713, 1811, 1915, 1916 capacitor
921 amplifier
922, 1001, 1002, 1813 resistance
1000 inverting amplification circuit
1320, 1520, 1920 timing generation circuit
1321 to 1324, 1521 to 1524, 1700, 1800, 1921 to 1924 buffer
1703, 1803 control terminal
1711 inverter
1812 diode

The invention claimed is:

1. A signal output circuit, including an operational amplifier including an amplification stage configured to amplify differential input voltage and an output stage configured to amplify an input signal outputted from the amplification stage and output the amplified input signal as an output signal,
wherein the output stage is a switched capacitor circuit comprising:
switches; and
a capacitor configured to sample differential voltage between input voltage outputted from the amplification stage and a given voltage other than the input voltage, and
wherein the switched capacitor circuit transfers the differential voltage sampled by the capacitor by switching of the switches based on the input voltage, and
wherein the operational amplifier further includes at least one resistor connected between an input terminal and an output terminal of the operational amplifier, the output stage outputs a signal having a larger amplitude than a potential difference between a power supply voltage and a ground voltage, and the input voltage outputted from the amplification stage ranges between the power supply voltage and the ground voltage.

2. The signal output circuit according to claim 1, wherein:
the switches are transistors, and
the switched capacitor circuit further includes control signal generating circuit which generates control signals for controlling the transistors, wherein control voltage of the control signals is based on voltage inputted into the switched capacitor circuit.

3. The signal output circuit according to claim 2, wherein the transistors include:
a first transistor group with a first conductivity type and a second conductivity type, for charging an electric charge based on the input signal with first voltage to the capacitor; and
a second transistor group with the second conductivity type different from the first conductivity type, for outputting the electric charge from the capacitor, and
the control signal generating circuit generates the control signals so that the control voltage of the control signals for on/off controlling the transistors in the first or second transistor groups connected to the capacitor is based on the input voltage.

4. The signal output circuit according to claim 1, wherein:
the switches are transistors, and
the switched capacitor circuit further includes control signal generating circuit which generates control signals for controlling the transistors, wherein control voltage of the control signals is based on voltage inputted into the switched capacitor circuit and voltage outputted from the switched capacitor circuit.

5. The signal output circuit according to claim 4, wherein:
the transistors includes:
a first transistor group with a first conductivity type for charging electric charge based on the input signal with first voltage to the capacitor; and
a second transistor group with a second conductivity type different from the first conductivity type for outputting the electric charge from the capacitor, and
the control signal generating circuit generates the control signals so that the control voltage of the control signal for on/off controlling the transistors in the first or second transistor groups connected to the capacitor is based on the input voltage and the output voltage.

6. The signal output circuit according to claim 5, wherein gate control voltage of the transistors is generated based on the output signal or the input signal of the switched capacitor circuit, in both cases of performing ON control of the transistor and performing OFF control of the transistor.

7. The signal output circuit according to claim 6, wherein withstanding voltage of the transistors is secured by controlling the control voltage.

8. The signal output circuit according to claim 7, wherein a maximum potential difference between a gate and a source of the transistors is set to Vo, where a high level of the voltage of the input signal is Vo.

9. The signal output circuit according to claim 2, wherein the control signal generating circuit includes buffers configured to generate the control signals.

10. The signal output circuit according to claim 9 further comprising a switch control timing generation circuit, and
wherein the control signals are generated by inputting signals having voltage based on ground voltage from the switch control timing generation circuit to the buffers.

11. The signal output circuit according to claim 3, wherein the transistors in the first transistor group or the second transistor group are configured as N-type or P-type transistors.

12. The signal output circuit according to claim 1, wherein the output stage operates on a high rate than an operating bandwidth of the amplification stage.

13. The signal output circuit according to claim 1, wherein the given voltage is power supply voltage.

14. The signal output circuit according to claim 1, wherein the given voltage is ground voltage.

15. The signal output circuit according to claim 1, wherein the given voltage is constant voltage.

16. The signal output circuit according to claim 1, wherein the given voltage is voltage supplied from an outside.

17. The signal output circuit according to claim 1, wherein the signal output circuit outputs output signal amplitude exceeding power supply voltage as the given voltage or output signal amplitude falling below ground voltage as the given voltage.

18. The signal output circuit according to claim 1, wherein the output stage has a plurality of configurations of switched capacitors.

19. The signal output circuit according to claim 18, wherein the plurality of switched capacitors are out of phase with each other in operations of sampling and transfer.

20. The signal output circuit according to claim 19, wherein at least one or more of the plurality of switched capacitors is in a sampling state at each of all time periods.

21. The signal output circuit according to claim 19, wherein at least one or more of the plurality of switched capacitors is in a transfer state at each of all time periods.

22. The signal output circuit according to claim 2, wherein the signal output circuit further comprises a smoothing capacitor at an output.

23. The signal output circuit according to claim 11, wherein the signal output circuit outputs output signal amplitude exceeding power supply voltage serving as the given voltage or output signal amplitude falling below ground voltage serving as the given voltage.

24. A signal output circuit comprising:
the signal output circuit according to claim 1; and
a feedback loop configured to return the output signal to an input of the operational amplifier.

25. A charge pump circuit for outputting an output signal from a semiconductor circuit including a flying capacitor, a smoothing capacitor, a first transistor group with a first conductivity type for charging an electric charge based on an input signal with first voltage in the flying capacitor, and a second transistor group with a second conductivity type different from the first conductivity type for recharging the electric charge from the flying capacitor to the smoothing capacitor, the output signal having second voltage stepped up or stepped down from the first voltage, the charge pump circuit comprising:
control signal generating circuit for generating control signals so that the control signals having control voltage for on/off controlling the transistors in the first or second transistor groups connected to the flying capacitor is based on the first voltage or the second voltage.

26. The charge pump circuit according to claim 25, wherein the control signal generating circuit includes buffers configured to generate the control signals.

* * * * *